US012733432B2

(12) United States Patent
Dokan

(10) Patent No.: US 12,733,432 B2
(45) Date of Patent: Sep. 8, 2026

(54) SUBSTRATE PROCESSING SYSTEM AND MAINTENANCE METHOD

(71) Applicant: Tokyo Electron Limited, Tokyo (JP)

(72) Inventor: Takashi Dokan, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 319 days.

(21) Appl. No.: 18/518,870

(22) Filed: Nov. 24, 2023

(65) Prior Publication Data

US 2024/0105478 A1 Mar. 28, 2024

Related U.S. Application Data

(63) Continuation of application No. PCT/JP2022/021104, filed on May 23, 2022.

(30) Foreign Application Priority Data

May 26, 2021 (JP) ................................ 2021-088086

(51) Int. Cl.
*H10P 72/00* (2026.01)
*H10P 72/30* (2026.01)

(52) U.S. Cl.
CPC ...... *H10P 72/0464* (2026.01); *H10P 72/0454* (2026.01); *H10P 72/0466* (2026.01); *H10P 72/3302* (2026.01)

(58) Field of Classification Search
CPC ............. H10P 72/0464; H10P 72/3302; H10P 72/0454; H10P 72/0466

(Continued)

(56) References Cited

U.S. PATENT DOCUMENTS

2010/0187201 A1* 7/2010 Fukuoka ............. H10P 72/3306 156/345.31
2017/0004985 A1* 1/2017 Nishi .................. H10P 72/0402
2017/0263477 A1* 9/2017 Eto ..................... H10P 72/0464

FOREIGN PATENT DOCUMENTS

JP H06172972 A 6/1994
JP H10-189558 A 7/1998

(Continued)

OTHER PUBLICATIONS

Translation JP2009302185 (Year: 2009).*
International Search Report issued on Jul. 12, 2022 for WO 22022/250014 A1, 5 pages including English Translation.

*Primary Examiner* — Terrell H Matthews
(74) *Attorney, Agent, or Firm* — XSENSUS LLP

(57) ABSTRACT

A substrate processing system comprises a substrate processing apparatus, a vacuum transport chamber, a transport mechanism, a suction mechanism and a controller. The substrate processing apparatus includes a vacuum processing chamber configured to perform processing of a substrate. The vacuum transport chamber is connected to the vacuum processing chamber and includes a transport port communicating with the vacuum processing chamber. The transport mechanism is disposed inside the vacuum transport chamber and configured to transport at least the substrate via the transport port. The suction mechanism is disposed inside the vacuum transport chamber and configured to suck an adhered object of a part inside the vacuum processing chamber via the transport port. The controller is configured to control the transport mechanism and the suction mechanism.

13 Claims, 14 Drawing Sheets

(58) Field of Classification Search
USPC .......................................................... 414/217
See application file for complete search history.

(56) References Cited

FOREIGN PATENT DOCUMENTS

| | | | | |
|---|---|---|---|---|
| JP | 2000173927 | A | | 6/2000 |
| JP | 2003-173978 | A | | 6/2003 |
| JP | 2004-014969 | A | | 1/2004 |
| JP | 2005-093850 | A | | 4/2005 |
| JP | 2008-053661 | A | | 3/2008 |
| JP | 2009302185 | A | * | 12/2009 |
| JP | 2021034725 | A | | 3/2021 |

* cited by examiner

SUBSTRATE PROCESSING SYSTEM AND MAINTENANCE METHOD

CROSS-REFERENCE TO RELATED APPLICATIONS

This application is a bypass continuation application of International Application No. PCT/JP2022/021104 having an international filing date of May 23, 2022 and designating the United States, the International Application being based upon and claiming the benefit of priority from Japanese Patent Application No. 2021-088086, filed on May 26, 2021, the entire contents of which are incorporated herein by reference.

TECHNICAL FIELD

This disclosure relates to a substrate processing system and a maintenance method.

BACKGROUND

There is a substrate processing apparatus that places a substrate such as a semiconductor wafer (hereinafter referred to as a "wafer") in a vacuum processing chamber in a vacuum state and performs various processing for manufacturing the substrate. In such a substrate processing apparatus, when various processing is performed in the vacuum processing chamber, reaction products, fine particles, or the like is cumulatively adhered to the inside of the vacuum processing chamber as an adhered object. Therefore, the vacuum processing chamber is regularly opened to the atmosphere and cleaned.

PRIOR ART DOCUMENTS

Patent Documents

Patent Document 1: Japanese Laid-open Patent Publication No. 2004-14969

SUMMARY

The present disclosure provides a technology capable of cleaning an inside of a vacuum processing chamber with high efficiency without opening the vacuum processing chamber to the atmosphere.

A substrate processing system according to one embodiment of the present disclosure comprises a substrate processing apparatus, a vacuum transport chamber, a transport mechanism, a suction mechanism and a controller. The substrate processing apparatus includes a vacuum processing chamber configured to perform processing of a substrate. The vacuum transport chamber is connected to the vacuum processing chamber and includes a transport port communicating with the vacuum processing chamber. The transport mechanism is disposed inside the vacuum transport chamber and configured to transport at least the substrate via the transport port. The suction mechanism is disposed inside the vacuum transport chamber and configured to suck an adhered object of a part inside the vacuum processing chamber via the transport port. The controller is configured to control the transport mechanism and the suction mechanism.

DETAILED DESCRIPTION

Hereinafter, embodiments of a substrate processing system and a maintenance method disclosed in the present application will be described in detail with reference to the drawings. Further, the same or corresponding portions in the respective drawings are denoted by the same reference signs. Further, the processing device disclosed in the present embodiment is not limited.

Incidentally, in the substrate processing apparatus, since the vacuum processing chamber is open to the atmosphere and cleaning is performed, there is concern that productivity may be degraded due to a vacuum processing stop time (downtime). Therefore, it is expected to clean the inside of the vacuum processing chamber with high efficiency without opening the vacuum processing chamber to the atmosphere.

Configuration Example of Substrate Processing System Related to Embodiment

Figure 1:
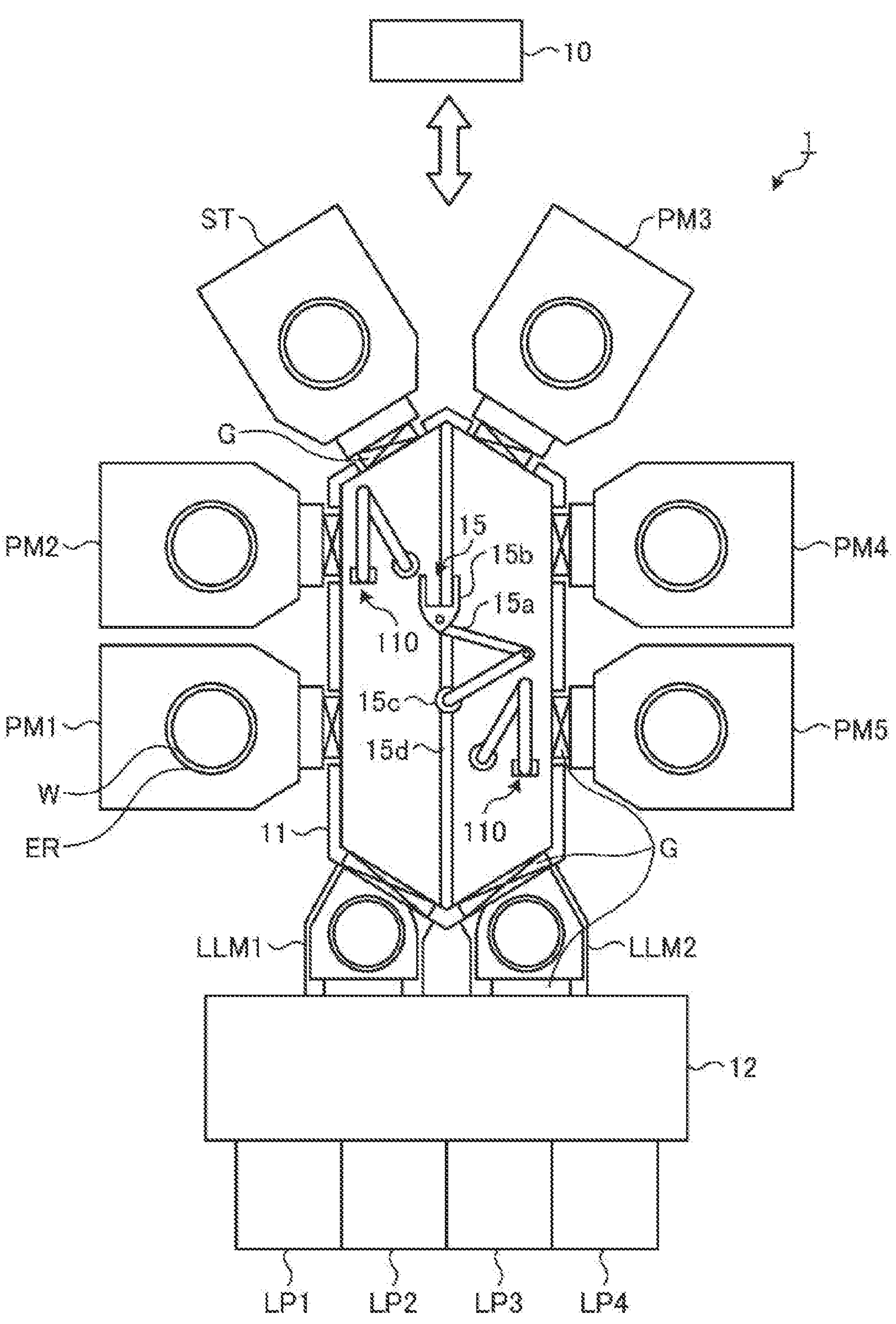
FIG. 1 is a schematic configuration diagram of a substrate processing system according to an embodiment.

FIG. 1 is a schematic configuration diagram of a substrate processing system 1 according to an embodiment.

The substrate processing system 1 includes a plurality of process modules (PM) PM1 to PM5, a storage chamber ST, a vacuum transport chamber 11, and a plurality of load lock modules (load lock chambers; LLM) LLM1 and LLM. Further, the substrate processing system 1 includes a normal pressure transport chamber 12, a plurality of load ports (LP: LP1 to LP4), and a controller 10.

In addition, in the example of FIG. 1, five process modules PM1 to PM5, two load lock modules LLM1 and LLM2, and four load ports LP1 to LP4 are illustrated. However, the numbers of process modules (PM), load lock modules (LLM), and load ports (LP) of the substrate processing system 1 are not limited to those shown. Hereinafter, the five process modules PM1 to PM5 are collectively referred to as a process module PM when there is no need for special distinction. Similarly, the two load lock modules LLM1 and LLM2 are collectively referred to as a load lock module LLM. Further, similarly, the four load ports LP1 to LP4 are collectively referred to as a load ports LP.

The process module PM executes processing of a semiconductor substrate, that is, a wafer W, in a vacuum atmosphere. The process module PM is an example of a vacuum processing device. The process module PM executes processes such as etching and film forming, for example. The process module PM includes a placement table that supports the wafer W, and an edge ring ER disposed to surround the wafer W on the placement table.

The process module PM is connected to the vacuum transport chamber 11 via a gate valve G that can be opened and closed. The gate valve G is closed while the wafer W is being processed inside the process module PM. The gate valve G opens when the processed wafer W is unloaded from the process module PM and when the unprocessed wafer W is loaded into the process module PM. Further, the gate valve G is also opened when the edge ring ER is loaded and unloaded from the process module PM. The process module PM is provided with a gas supply portion for supplying a predetermined gas and an exhaust portion capable of vacuum suction. Details of the process module PM will be further described below.

The storage chamber ST stores the edge ring ER. A plurality of stages of supports are provided at predetermined intervals in a vertical direction inside the storage chamber ST. Among the plurality of supports, the support provided on the upper end side is a pedestal on which a replacement edge ring ER is placed. Further, the replacement edge ring ER is, for example, a new unused edge ring. Further, the replacement edge ring ER is a fully used edge ring, but may be an edge ring with relatively low consumption. Among the plurality of supports, the support disposed on the lower end side is a pedestal on which the used edge ring ER or a temporarily retreated edge ring ER is placed. The support on the lower side is empty. Further, the storage chamber ST includes an exhaust mechanism, such as a vacuum pump and a leak valve, and an atmosphere in the storage chamber ST can be switched between the atmospheric (normal pressure) atmosphere and the vacuum (decompressing) atmosphere. The storage chamber ST is configured to communicate with the vacuum transport chamber 11 via a transport port used for loading and unloading the edge ring ER. A gate valve G that can be opened and closed is provided at the transport port.

The vacuum transport chamber 11 includes a gas supply portion and an exhaust portion capable of vacuum suction, which are not illustrated, and the inside of the vacuum transport chamber 11 can be maintained in a vacuum atmosphere. The vacuum transport chamber 11 is connected to the process module PM and the load lock module LLM. The vacuum transport chamber 11 is configured to communicate with the process module PM and the load lock module LLM via a transport port used for loading and unloading the wafer W and the edge ring ER. A gate valve G that can be opened and closed is provided at the transport port.

In the vacuum transport chamber 11, a transport mechanism 15 is disposed to transport the wafer W and the edge ring ER (hereinafter also referred to as transport objects). The transport mechanism 15 transports the wafer W between the process modules PM1 to PM5 and the load lock modules LLM1 and LLM2. For example, when the transport mechanism 15 transports the wafer W from the load lock module LLM to the process module PM and the process module PM performs a vacuum treatment on the wafer W, the transport mechanism 15 takes out the wafer W from the lock module LLM. The transport mechanism 15 transports the wafer W taken out from the load lock module LLM, into the process module PM from the vacuum transport chamber 11 via the transport port. Further, for example, when the wafer W processed in the process module PM is transported to the load lock module LLM, the transport mechanism 15 unloads the wafer W from the process module PM via the transport port. The transport mechanism 15 transports the wafer W unloaded from the process module PM, from the vacuum transport chamber 11 to the load lock module LLM via the transport port. Further, the transport mechanism 15 transports the edge ring ER between the process modules PM1 to PM5 and the storage chamber ST. For example, when the edge ring ER is transported from the process module PM to the storage chamber ST and the edge ring is stored in the storage chamber ST, the transport mechanism 15 unloads the edge ring ER from the process module PM via the transport port. The transport mechanism 15 transports the edge ring ER unloaded from the process module PM from the vacuum transport chamber 11 to the storage chamber ST via the transport port. Further, for example, when the edge ring ER temporarily unloaded from the process module PM and retreated to the support in the storage chamber ST is transported again and placed on the placement table inside the process module PM, or when the replacement edge ring ER is transported from the storage chamber ST to the process module PM and is placed on the placement table inside the process module PM, the transport mechanism 15 takes out the replacement edge ring ER from the storage chamber ST via the transport port. The transport mechanism 15 loads the edge ring ER taken out from the storage chamber ST, into the process module PM from the vacuum transport chamber 11 via the transport port.

Further, a suction mechanism 110 is disposed in the vacuum transport chamber 11. The suction mechanism 110 sucks an adhered object of the placement table inside the vacuum processing chamber (a processing container 30 to be described below) of the process module PM via the transport port of the vacuum transport chamber 11. Details of the suction mechanism 110 will be further described below.

The load lock module LLM is disposed side by side along two sides of the vacuum transport chamber 11 in which the process module PM and the storage chamber ST are not disposed. The load lock module LLM and the vacuum transport chamber 11 are configured to internally communicate through the gate valve G. The load lock module LLM includes a pedestal on which the wafer W is placed, and a support pin that raises and lowers the wafer W. A configuration of the support pin may be the same as that of the first lifter pin and the second lifter pin in the process module PM. The load lock module LLM includes an exhaust mechanism such as a vacuum pump and a leak valve, and the load lock module LLM may switches atmospheres of the load lock module LLM between an atmospheric (normal pressure) atmosphere and a vacuum (decompressing) atmosphere.

The load lock module LLM is connected to the normal pressure transport chamber 12 on the side opposite to the side connected to the vacuum transport chamber 11. The load lock module LLM and the normal pressure transport chamber 12 are configured to communicate internally through the gate valve G.

The normal pressure transport chamber 12 is maintained in the atmospheric (normal pressure) atmosphere. In the example of FIG. 1, the normal pressure transport chamber 12 has a substantially rectangular shape when viewed from the top. A plurality of load lock modules LLM are installed side by side on one long side of the normal pressure transport chamber 12. Further, a plurality of load ports LP are provided in parallel on one long side of the normal pressure transport chamber 12. Each load port LP includes a carrier in which the wafer W is accommodated. The normal pressure transport chamber 12 includes a transport mechanism such as an arm, and the transport mechanism is configured to transport the wafer W between the load lock module LLM and the load port LP.

In addition, a case in which the storage chamber ST is configured to communicate with the vacuum transport chamber 11 has been described by way of example in FIG. 1, but a position of the storage chamber ST is not limited thereto and the storage chamber ST may be provided, for example, adjacent to the normal pressure transport chamber 12. In this case, the edge ring ER is loaded into and out of the process module PM via the normal pressure transport chamber 12, the load lock module LLM, and the vacuum transport chamber 11.

An operation of the substrate processing system 1 configured as described above is generally controlled by the controller 10. The controller 10 is, for example, a computer including a program, memory, CPU, and the like, and controls each portion of the substrate processing system 1.

Configuration Example of Process Module (PM)

Figure 2:
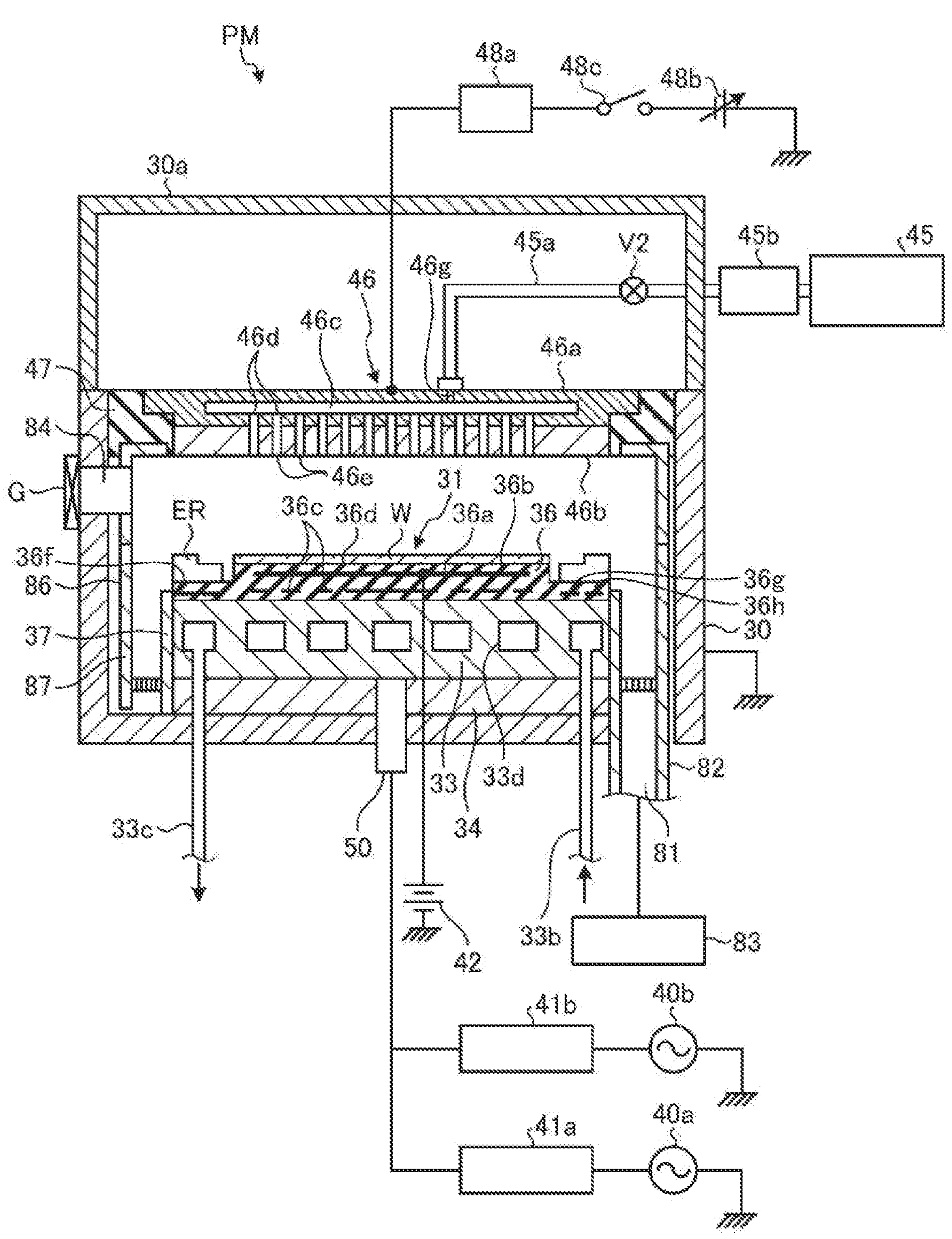
FIG. 2 is a diagram schematically illustrating an example of a process module included in the substrate processing system according to the embodiment.

FIG. 2 is a diagram schematically illustrating an example of the process module (PM) included in the substrate processing system 1 according to the embodiment. The process module PM illustrated in FIG. 2 is a parallel plate-type plasma processing device.

The process module PM is configured to be airtight and includes a processing container 30 that is electrically at ground potential. The processing container 30 is an example of a vacuum processing chamber. The processing container 30 is cylindrical and is made of, for example, aluminum with an anodized film formed on a surface. The processing container 30 defines a processing space in which plasma is generated. A placement table 31 that supports the wafer W horizontally is accommodated inside the processing container 30.

The placement table 31 has a substantially cylindrical shape directed to a bottom surface in a vertical direction, and an upper surface thereof serves as a placement surface 36*d*. The placement surface 36*d* of the placement table 31 is slightly smaller than the wafer W. The placement table 31 includes a base 33 and an electrostatic chuck 36.

The base 33 is made of a conductive metal, such as aluminum. The base 33 functions as a lower electrode. The base 33 is supported on an insulating support 34, and the support 34 is installed at a bottom portion of the processing container 30.

The electrostatic chuck 36 has a convex substrate placement portion formed in a central portion on the upper side, and a top surface of the substrate placement portion serves as the placement surface 36*d* on which the wafer W is placed. The electrostatic chuck 36 is provided at a center of the placement table 31 when viewed in plan view. The electrostatic chuck 36 is an example of a first placement portion on which a substrate is placed. The electrostatic chuck 36 includes an electrode 36*a* and an insulator 36*b*. The electrode 36*a* is provided inside the insulator 36*b*, and a direct current power supply 42 is connected to the electrode 36*a*. The electrostatic chuck 36 is configured to adsorb the wafer W with Coulomb force by a direct current voltage from the direct current power supply 42 being applied to the electrode 36*a*. Further, the electrostatic chuck 36 is provided with a heater 36*c* inside the insulator 36*b*. Power is supplied to the heater 36*c* through a power supply mechanism to be described below so that a temperature of the wafer W is controlled.

Further, an outer circumferential portion (an example of the second placement portion) formed by an insulator 36*b* and lower than the placement surface 36*d* is provided around the placement surface 36*d* of the placement table 31, and a top surface of the outer circumferential portion is provided as an ER placement surface 36*f* on which the edge ring ER is placed. The edge ring ER is disposed to surround the wafer W placed on the placement surface 36*d* on the ER placement surface 36*f* of the placement table 31. The edge ring ER is formed of, for example, single crystal silicon. The electrostatic chuck 36 includes the pair of electrodes 36*g* and 36*h* at positions overlapping the edge ring ER when viewed in the top view. The pair of electrodes 36*g* and 36*h* is provided inside the insulator 36*b*. The electrostatic chuck 36 is configured to adsorb the edge ring ER with Coulomb force by a direct current voltage from a direct current power supply (not illustrated) being applied to the pair of electrodes 36*g* and 36*h*. Further, although a case in which the pair of electrodes 36*g* and 36*h* are provided in the electrostatic chuck 36 is illustrated in the example of FIG. 1, the pair of electrodes 36*g* and 36*h* may be provided in a ring-shaped dielectric that is separate from the electrostatic chuck 36. Further, although a case in which the pair of electrodes 36*g* and 36*h* constitutes a bipolar electrode is illustrated in the example of FIG. 1, a unipolar electrode may be used instead of the pair of electrodes 36*g* and 36*h*. Further, a cylindrical inner wall member 37 made of, for example, quartz is provided to surround the placement table 31 and the support 34.

Further, in the placement table 31, a first lifter pin (not illustrated) is provided to be able to be raised and lowered from the placement surface 36*d*, and a second lifter pin (not illustrated) is to be able to be raised and lowered from a top surface of an outer circumferential portion of the placement table 31. When the first lifter pin is raised, the wafer W can be lifted from the placement surface 36*d*. When the second lifter pin is raised, the edge ring ER can be lifted from the top surface of the outer circumferential portion of the placement table 31.

A feed rod 50 is connected to the base 33. A first RF power supply 40*a* is connected to the feed rod 50 via a first matcher 41*a*, and a second RF power supply 40*b* is connected to the feed rod 50 via a second matcher 41*b*. The first RF power supply 40*a* is a power supply for plasma generation, and is configured to supply high frequency power at a predetermined frequency to the base 33 of the placement table 31. Further, the second RF power supply 40*b* is a power supply for ion introduction (bias), and is configured to supply high frequency power at a predetermined frequency lower than that of the first RF power supply 40*a* to the base 33 of the placement table 31.

A flow path 33*d* is formed inside the base 33. The flow path 33*d* has one end to which a heat transfer fluid inlet pipe 33*b* connected, and the other end to which a heat transfer fluid outlet pipe 33*c* connected. The process module PM is configured to be able to control a temperature of the placement table 31 by circulating a heat transfer fluid, such as a highly insulating, low-viscosity fluorine-based inert liquid, pure water, or the like within the flow path 33*d*. Further, the process module PM may be configured to have a separate flow path provided inside the base 33 corresponding to respective regions in which the wafer W and the edge ring ER are placed, and to be able to individually control the temperature of the wafer W and the edge ring ER. Further, the process module PM may be configured to individually control the temperature by supplying heat transfer gas to a back side of the wafer W or the edge ring ER. For example, a gas supply pipe for supplying a heat transfer gas (backside gas) such as a helium gas may be provided on the back side of the wafer W to penetrate the placement table 31 or the like. The gas supply pipe is connected to a gas supply source. With this configuration, the wafer W held by the electrostatic chuck 36 on a top surface of the placement table 31 is controlled to a predetermined temperature.

Meanwhile, a shower head 46 having a function of an upper electrode is provided above the placement table 31 to face the placement table 31 in parallel. The shower head 46 and the placement table 31 function as a pair of electrodes (an upper electrode and a lower electrode).

The shower head 46 is provided on a ceiling wall of the processing container 30. The shower head 46 includes a body portion 46*a* and an upper ceiling plate 46*b* forming an electrode plate, and is supported on an upper part of the processing container 30 via an insulating member 47. The body portion 46*a* is made of a conductive material, such as aluminum with an anodized film formed on a surface thereof, and is configured to detachably support the upper ceiling plate 46*b* at a lower portion thereof.

A gas diffusion chamber 46*c* is provided inside the body portion 46*a*, and a plurality of gas flow holes 46*d* is formed at a bottom portion of the body portion 46*a* to be located at the lower portion of the gas diffusion chamber 46*c*. Further, in the upper ceiling plate 46*b*, a gas introduction hole 46*e* is provided to penetrate the upper ceiling plate 46*b* in a thickness direction and overlap the above-described gas flow hole 46*d*. With this configuration, a processing gas supplied to the gas diffusion chamber 46*c* is distributed and supplied in a shower form into the processing container 30 through the gas flow hole 46*d* and the gas introduction hole 46*e*.

A gas introduction port 46*g* for introducing a processing gas into the gas diffusion chamber 46*c* is formed in the body portion 46*a*. A gas supply pipe 45*a* is connected to this gas introduction port 46*g*. A processing gas supply source 45 that supplies processing gas is connected to the other end of this gas supply pipe 45*a*. A mass flow controller (MFC) 45*b* and an opening and closing valve V2 are provided in this order from the upstream side in the gas supply pipe 45*a*. A processing gas for plasma etching is supplied from the processing gas supply source 45 to the gas diffusion chamber 46*c* through the gas supply pipe 45*a*, and is distributed and supplied into the processing container 30 in a shower-like manner through the gas flow hole 46*d* and the gas introduction hole 46*e* from the gas diffusion chamber 46*c*.

A variable direct current power supply 48*b* is electrically connected to the shower head 46 serving as the upper electrode described above via a low pass filter (LPF) 48*a*. This variable direct current power supply 48*b* is configured so that power supply can be turned on or off by an on and off switch 48*c*. A current or voltage of the variable direct current power supply 48*b* and on or off of the on and off switch 48*c* are controlled by the controller 10, which will be described below. Further, a on and off switch 48*c* is turned on by the controller 10 as necessary and a predetermined direct current voltage is applied to the shower head 46 serving as the upper electrode, in order for high frequencies to be applied to the placement table 31 from the first RF power supply 40*a* and the second RF power supply 40*b* so that plasma is generated in the processing space, as will be described below.

Further, a cylindrical grounding conductor 30*a* is provided to extend upward from a position of a height of the shower head 46 from a side wall of the processing container 30. This cylindrical grounding conductor 30*a* has a ceiling wall at an upper portion thereof.

An exhaust port 81 is formed at the bottom portion of the processing container 30, and an exhaust device 83 is connected to this exhaust port 81 via an exhaust pipe 82. The exhaust device 83 includes a vacuum pump and is configured to decompress the inside of the processing container 30 to a predetermined vacuum degree by operating the vacuum pump.

Meanwhile, a gate 84 used for loading or unloading the wafer W is provided on a side wall of the processing container 30. The gate 84 is provided with a gate valve G that opens or closes the gate 84. As illustrated in FIG. 1, the gate 84 is connected to the transport port of the vacuum transport chamber 11 via the gate valve G while maintaining airtightness, and allows the wafer W to be loaded into or unloaded from the vacuum transport chamber 11 in a vacuum atmosphere state.

A depo shield 86 is provided along the inner wall surface on the inner side of a side portion of the processing container 30. The depo shield 86 prevents reaction products (depo) generated by etching using plasma from adhering to the processing container 30. The depo shield 86 is configured to be detachable.

The process module PM having the above configuration is connected to the controller 10 of the substrate processing system 1. The controller 10 controls each portion of the process module PM.

Incidentally, in the process module PM, when various processing is performed inside the processing container 30 which is a vacuum processing chamber, reaction products, fine particles, or the like is cumulatively adhered to the inside of the processing container 30 as an adhered object, and thus, cleaning inside the processing container 30 is performed regularly. In the process module PM, when the processing container 30 is open to the atmosphere and cleaning is performed, a large amount of time (down time), such as a vacuuming time for reducing residual moisture inside the processing container 30 or temperature adjustment time inside the processing container 30 after the start of vacuuming of the processing container 30, in addition to a time for opening the processing container 30 to the atmosphere or a cleaning time, is required until an etching process for the wafer W is resumed. As a result, there is concern that the productivity of the process module PM may decrease. Therefore, from the viewpoint of reducing downtime, it is desirable to clean the inside of the processing container 30 without opening the vacuum processing chamber to the atmosphere.

Therefore, in the substrate processing system 1 according to the embodiment, the suction mechanism 110 for cleaning the inside of the processing container 30 is disposed adjacent to the transport mechanism 15 for transporting the wafer W to the processing container 30, in the vacuum transport chamber 11 connected to the processing container 30 in the process module PM, as illustrated in FIGS. 1 and 2. The suction mechanism 110 sucks adhesion to a target object inside the processing container 30 via the transport port used for loading and unloading of the wafer W by the transport mechanism 15. Accordingly, since an object adhered to the target object inside the processing container 30 can be sucked from a transport system side that transports the wafer W into the processing container 30, it is possible to clean the inside of the processing container 30 with high efficiency without opening the vacuum processing chamber to the atmosphere.

Configuration Example of Suction Mechanism 110

Figure 3:
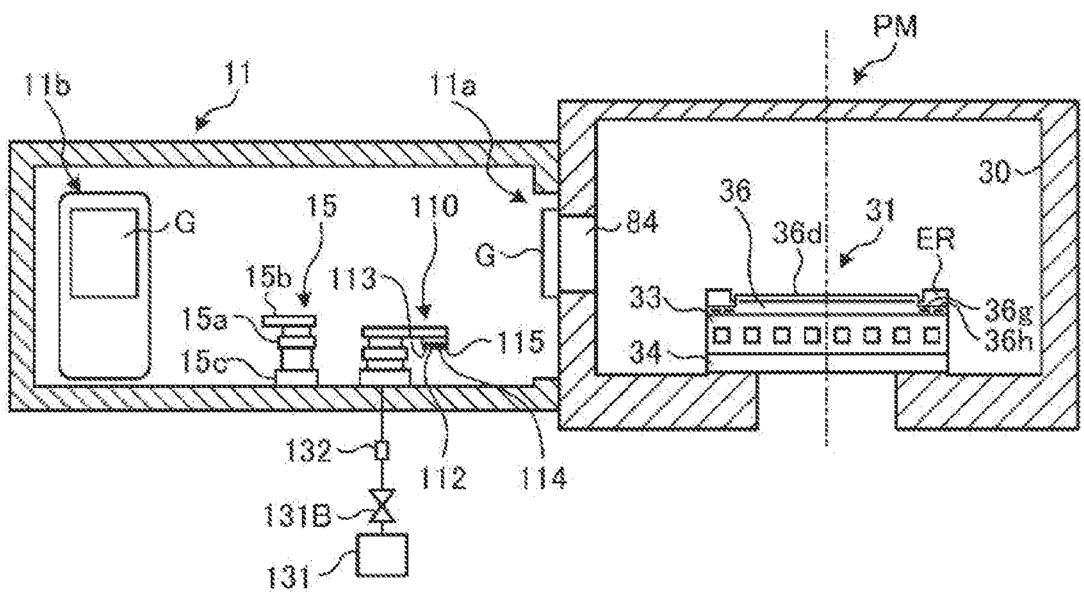
FIG. 3 is a longitudinal cross-sectional view illustrating an example of an internal configuration of a vacuum transport chamber according to the embodiment.

Next, details of a configuration of the suction mechanism 110 will be described with reference to FIGS. 1 and 3. FIG. 3 is a longitudinal cross-sectional view illustrating an example of an internal configuration of the vacuum transport chamber 11 according to the embodiment. In FIG. 3, a cross section near a coupling portion (connection portion) between the vacuum transport chamber 11 and the process module PM is illustrated. Further, in each drawing below, the process module PM is illustrated in a simplified manner. Further, hereinafter, a configuration of the suction mechanism 110 will be appropriately described according to a flow of cleaning the placement table 31 as the target object in the processing container 30.

The vacuum transport chamber 11 includes a transport port 11*a* and is configured to be able to communicate with the process module PM (the processing container 30) via the transport port 11*a*. The transport port 11*a* communicates with the processing container 30 when the gate valve G provided at the gate 84 of the process module PM opens. In the example of FIG. 3, the gate valve G of the process module PM is closed.

The transport mechanism 15 is disposed inside the vacuum transport chamber 11. The transport mechanism 15 includes an arm portion 15*a* in which a plurality of arm elements are rotatably connected by joints, and a fork portion 15*b* provided at the tip of the arm portion 15*a*. The arm portion 15*a* is supported by a support portion 15*c*. The support portion 15*c* is configured to be movable in a horizontal direction and to be able to be raised and lowered in a vertical direction according to a rail 15*d* (see FIG. 1; the rail 15*d* is omitted in FIG. 3) disposed on the bottom surface of the vacuum transport chamber 11. The fork portion 15*b* holds the transport objects, that is, the wafer W and the edge ring ER. The transport mechanism 15 can expand and contract the arm portion 15*a* in the horizontal direction by bending the joints. The transport mechanism 15 can move the fork portion 15*b* at the tip of the arm portion 15*a* in a vertical direction by raising and lowering the arm portion 15*a* with the support portion 15*c*. The transport mechanism 15 holds the transport objects with the fork portion 15*b*, and expands and contracts the arm portion 15*a* to transport (load) the transport objects from the vacuum transport chamber 11 to the processing container 30 via the transport port 11*a* when the gate valve G of the process module PM opens. Further, the transport mechanism 15 expands and contracts the arm portion 15*a* to transport (unload) the transport objects from the processing container 30 to the vacuum transport chamber 11 via the transport port 11*a*. An operation of the transport mechanism 15 is generally controlled by the controller 10.

Further, the vacuum transport chamber 11 includes a transport port 11*b* and is configured to be able to communicate with the load lock module LLM via the transport port 11*b*. The transport port 11*b* communicates with the load lock module LLM when the gate valve G of the load lock module LLM opens. In the example of FIG. 3, the gate valve G of the load lock module LLM is closed.

When the gate valve G of the load lock module LLM opens, the transport mechanism 15 expands and contracts the arm portion 15*a* to transport (unload) the transport objects from the load lock module LLM to the vacuum transport chamber 11 via the transport port 11*b*. Further, the transport mechanism 15 expands and contracts the arm portion 15*a* to transport (load) the transport objects from the vacuum transport chamber 11 to the load lock module LLM via the transport port 11*b*.

The suction mechanism 110 that suctions object to adhered to the placement table 31 inside the processing container 30 is disposed adjacent to the transport mechanism 15 inside the vacuum transport chamber 11. In the example of FIG. 1, two suction mechanisms 110 are disposed. In the example of FIG. 3, the illustration of one of the two suction mechanisms 110 is omitted. In addition, the number of suction mechanisms 110 is not limited to two, and may be two or more, and may be one. Further, the suction mechanism 110 may be provided on a rail (not illustrated) disposed on the bottom surface of the vacuum transport chamber 11, and may be configured to be movable on this rail.

Figure 4:
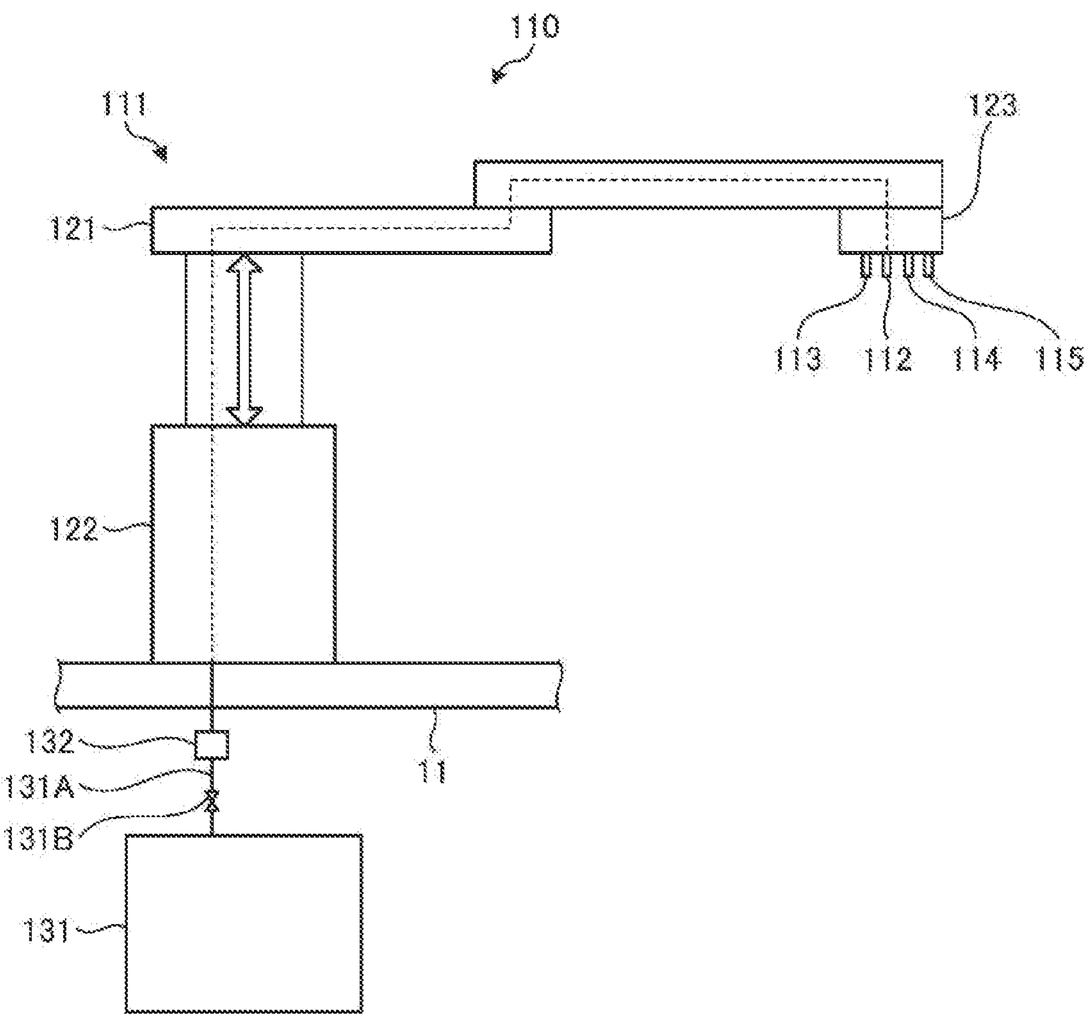
FIG. 4 is a diagram illustrating details of a suction mechanism related to the embodiment.

FIG. 4 is a diagram illustrating details of the suction mechanism 110 related to the embodiment. The suction mechanism 110 includes a robot arm 111, and a suction port 112, a supply port 113, an irradiation portion 114 and an imaging portion 115 provided at a tip of the robot arm 111.

The robot arm 111 includes an arm portion 121 in which a plurality of arm elements are rotatably connected by joints, a support portion 122 that supports the arm portion 121, and a head portion 123 provided at the tip of the arm portion 121. The support portion 122 is configured to be movable in a horizontal direction and to be able to be raised and lowered in a vertical direction. The robot arm 111 can expand and contract the arm portion 121 in the horizontal direction by bending the joints. The robot arm 111 can move the head portion 123 at the tip of the arm portion 121 in the vertical direction by raising and lowering the arm portion 121 with the support portion 122. When the gate valve G of the process module PM opens, the robot arm 111 extends the arm portion 121 and causes the head portion 123 to be close to the placement table 31 via the transport port 11*a*. An operation of the robot arm 111 is generally controlled by the controller 10.

The suction port 112, the supply port 113, the irradiation portion 114, and the imaging portion 115 are provided on the lower surface of the head portion 123. Disposition positions of the suction port 112, the supply port 113, the irradiation portion 114, and the imaging portion 115 will be described below.

The suction port 112 sucks the adhered object of the placement table 31 as the head portion 123 approaches the placement table 31. That is, the suction port 112 is connected to the exhaust device 131 via an exhaust pipe 131A that penetrates the robot arm 111, and the exhaust pipe 131A is provided with a valve 131B that can be opened and closed. When the valve 131B opens, the suction port 112 sucks the object to adhered to the placement table 31 through an exhaust operation of the exhaust device 131.

The supply port 113 supplies an inert gas to the placement table 31 as the head portion 123 approaches the placement table 31. The gas supplied from the supply port 113 is an inert gas, a gas that reacts with an adhered object to facilitate suction of an object adhered to the placement table 31, or a gas that reacts with an adhered object to gasify the adhered object. As the inert gas, for example, Ar, $N_2$, dry air, or the like is used. When an inert gas is used, a gas flow rate is set appropriately so that the object to adhered to the placement table 31 is blown away. Examples of the gas that reacts with the adhered object to facilitate the suction of the object adhered to the placement table 31, or the gas that reacts with the adhered object to gasify the adhered object may include a nitrogen trifluoride gas ($NF_3$) and a fluorine gas ($F_2$). The suction port 112 sucks the adhered object together with the gas supplied from the supply port 113. The supply port 113 is connected to a gas supply source (not illustrated) through a pipe penetrating the robot arm 111, and supplies a gas supplied from the gas supply source to the placement table 31.

When the head portion 123 approaches the placement table 31, the irradiation portion 114 irradiates the placement table 31 with plasma and removes the adhered object from the placement table 31. The irradiation portion 114 can reduce the adhesion force of the adhered object or gasify the adhered object by causing the adhered object to react with ions or radicals in the plasma. The adhered object with reduced adhesion force or gasified adhered object leaves the placement table 31 and is sucked in from the suction port 112. The irradiation portion 114 irradiates the placement table 31 with plasma obtained by applying high-frequency power to a gas such as $O_2$, $O_2$/Ar, or a fluorine-containing gas ($CF_4$ or the like), for example. In addition, the irradiation portion 114 may irradiate the placement table 31 with laser, or may irradiate the placement table 31 with plasma or laser. The laser may be a laser that heats the adhered object and reduces the adhesion force of the adhered object. The laser may be a laser with a wavelength for gasifying the adhered object. For example, a semiconductor laser with a wavelength of 808 nm, a laser spot area of 0.5 to 3 mm, and a laser power of 200 W may be used. Further, the irradiation portion 114 may irradiate the placement table 31 with the laser in an environment in which there is a gas (for example, an ozone gas) functioning to reduce the adhesion force of the adhered object or gasifying the adhered object.

The imaging portion 115 is, for example, an image sensor, and images the placement table 31 when the head portion 123 approaches the placement table 31. Further, the imaging portion 115 may image the placement table 31 while irradiating the placement table 31 with light as needed. An operation of the imaging portion 115 is generally controlled by the controller 10. The imaging portion 115 outputs a captured image obtained by imaging the placement table 31 to the controller 10. The controller 10 detects the presence or absence of an adhered object on the placement table 31 from the captured image. When the adhered object is detected from the captured image, the controller 10 controls the valve 131B to start suction of the adhered object from the suction port 112.

Further, a measurement device 132 is provided in the exhaust pipe 131A. The measurement device 132 measures a diameter and number of fine particles flowing inside the exhaust pipe 131A, and outputs information on the number of particles for each predetermined particle diameter category and information on a total number of fine particles to the controller 10. When suction is performed from the suction port 112, the controller 10 monitors whether the number of particles for each predetermined particle diameter category and the total number of fine particles obtained from the measurement device 132 are equal to or less than a predetermined threshold value. The controller 10 controls the valve 131B to stop suction from the suction port 112 when the number of particles for each predetermined particle diameter category and the total number of fine particles are equal to or less than the predetermined threshold value.

Figure 5:
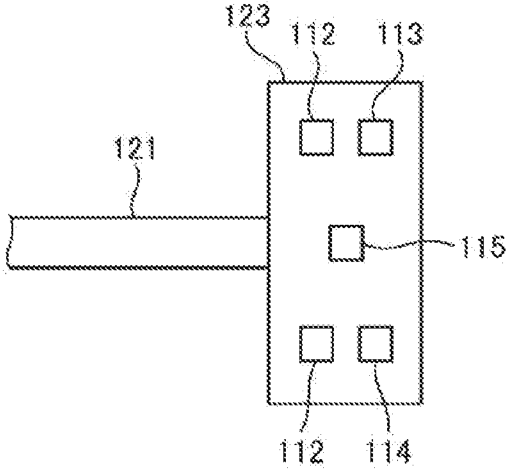
FIG. 5 is a diagram illustrating an example of disposition of a suction port, a supply port, an irradiation portion, and an imaging portion according to the embodiment.

FIG. 5 is a diagram illustrating an example of disposition of the suction port 112, the supply port 113, the irradiation portion 114, and the imaging portion 115 according to the embodiment. In FIG. 5, a view of the head portion 123 of the robot arm 111 viewed from below is illustrated. The head portion 123 is formed in a rectangular shape in which a pair of short sides are disposed with the arm portion 121 interposed therebetween, when viewed in plan view. The suction port 112 is provided along each short side at positions on the inner side of the pair of short sides of the head portion 123. The supply port 113 is provided at a position adjacent to one of the two suction ports 112, and the irradiation portion 114 is provided at a position adjacent to the other one of the two suction ports 112. The imaging portion 115 is provided at a center of the lower surface of the head portion 123.

Figure 6:
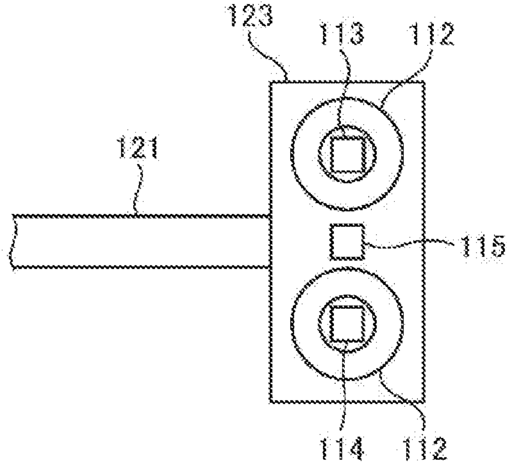
FIG. 6 is a diagram illustrating another example of the disposition of a suction port, a supply port, an irradiation portion, and the imaging portion according to the embodiment.

Further, the disposition positions of the suction port 112, the supply port 113, the irradiation portion 114, and the imaging portion 115 illustrated in FIG. 5 are examples and are not limited thereto. For example, the suction port 112 may be provided at a position surrounding the outer circumference of each of the supply port 113 and the irradiation portion 114 at position on the inner side of a pair of short sides of the head portion 123, as illustrated in FIG. 6. FIG. 6 is a diagram illustrating another example of the disposition of the suction port 112, the supply port 113, the irradiation portion 114, and the imaging portion 115 according to the embodiment. Further, in FIGS. 5 and 6, the imaging portion 115 is provided on the lower surface of the head portion 123 like the suction port 112, the supply port 113, and the irradiation portion 114, but may be provided on the side of the head portion 123.

Further, although an example in which the suction port 112, the supply port 113, the irradiation portion 114, and the imaging portion 115 are disposed on the lower surface of the head portion 123 is illustrated in FIG. 5, the suction port 112, the supply port 113, the irradiation portion 114, and the imaging portion 115 may be additionally disposed on the other side of the tip of the robot arm 111. For example, the suction port 112, the supply port 113, the irradiation portion 114, and the imaging portion 115 may be additionally disposed on a side surface or a top surface of the tip of the robot arm 111. This makes it possible to clean the inside of the processing container 30 in a wide area.

Figure 7:
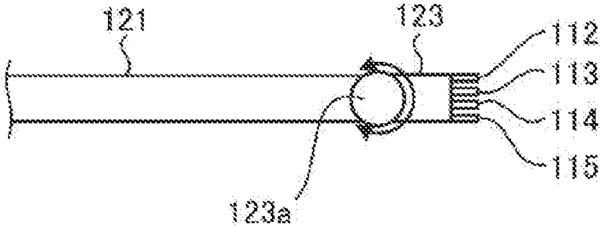
FIG. 7 is a diagram illustrating a configuration of a head portion according to a modification example of the embodiment.

Further, the head portion 123 may be configured to be rotatable in the vertical or horizontal direction. For example, as illustrated in FIG. 7, the head portion 123 is rotatably fixed to the tip of the arm portion 121 in the vertical direction via the rotation axis 123*a*, and the directions of the suction port 112, the supply port 113, the irradiation portion 114, and the imaging portion 115 may be changed by changing the direction of the head portion 123. FIG. 7 is a diagram illustrating the configuration of the head portion 123 according to a modification example of the embodiment. In FIG. 7, a state in which the suction port 112, the supply port 113, the irradiation portion 114, and the imaging portion 115 are provided on the side of the head portion 123. For example, the robot arm 111 rotates the head portion 123 upward from a state illustrated in FIG. 7 via the rotation axis 123*a* to change directions of the suction port 112, the supply port 113, the irradiation portion 114, and the imaging portion 115 upward. Further, for example, the robot arm 111 rotates the head portion 123 downward from the state illustrated in FIG. 7 via the rotation axis 123*a* to changes the directions of the suction port 112, the supply port 113, the irradiation portion 114, and the imaging portion 115 a downward direction. This configuration makes it possible to clean all locations of the processing container 30, such as an upper portion, side portions, and a lower portion. In addition, in FIG. 7, the suction port 112, the supply port 113, the irradiation portion 114, and the imaging portion 115 are disposed in the vertical direction on the side of the head portion 123, but are not limited thereto and several dispositions may be taken. Further, cleaning is not limited to the inside of the processing container 30, but may also be performed inside the load lock module LLM or inside the vacuum transport chamber 11.

Figure 8:
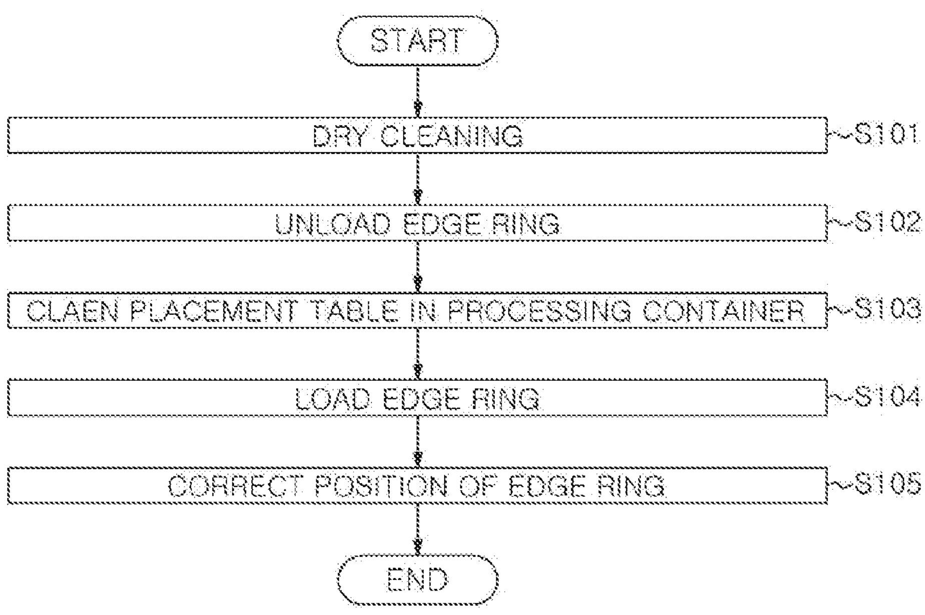
FIG. 8 is a flowchart illustrating an example of a processing operation of the substrate processing system according to the embodiment.

Next, a specific processing operation of the substrate processing system 1 will be described with reference to FIG. 8. FIG. 8 is a flowchart illustrating an example of a processing operation of the substrate processing system 1 according to the embodiment. The processing operation illustrated in FIG. 8 are mainly executed under control of the controller 10.

First, dry cleaning is performed on the processing container 30 in a state where the edge ring ER is placed on the placement table 31 (step S101).

When the dry cleaning is completed, the edge ring ER is unloaded from the processing container 30 by the transport mechanism 15 (step S102).

Subsequently, the placement table 31 inside the processing container 30 is cleaned by the suction mechanism 110 (step S103).

When cleaning is completed, a replacement edge ring ER is loaded into the processing container 30 (step S104).

Thereafter, the position of the edge ring ER is corrected (step S105).

Figure 9A:
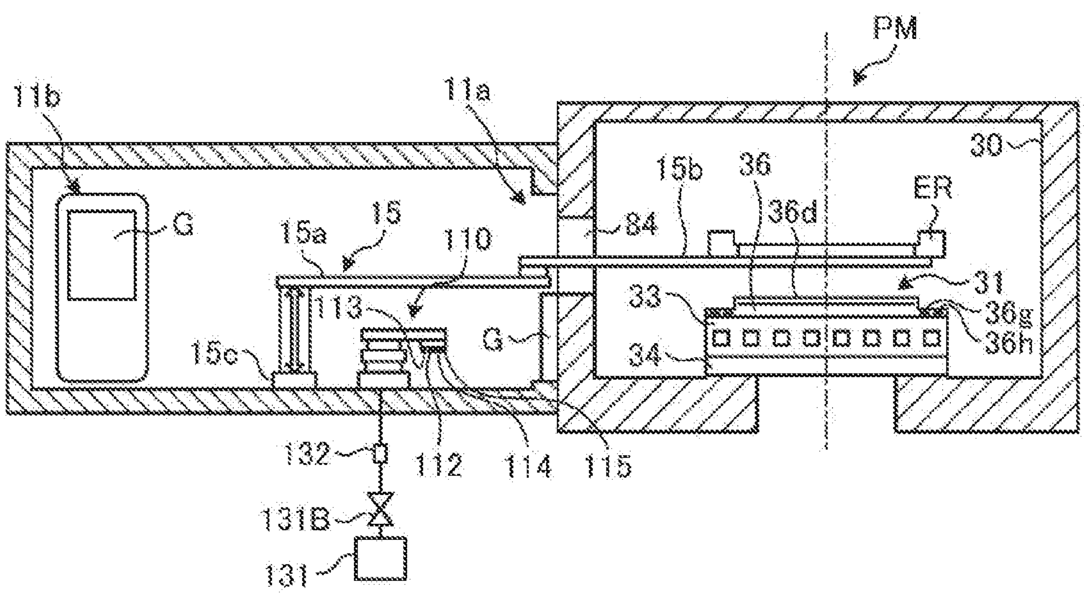
FIG. 9A is a diagram illustrating an example of an operation when an edge ring is unloaded from a processing container and a placement table is cleaned.
Figure 9B:
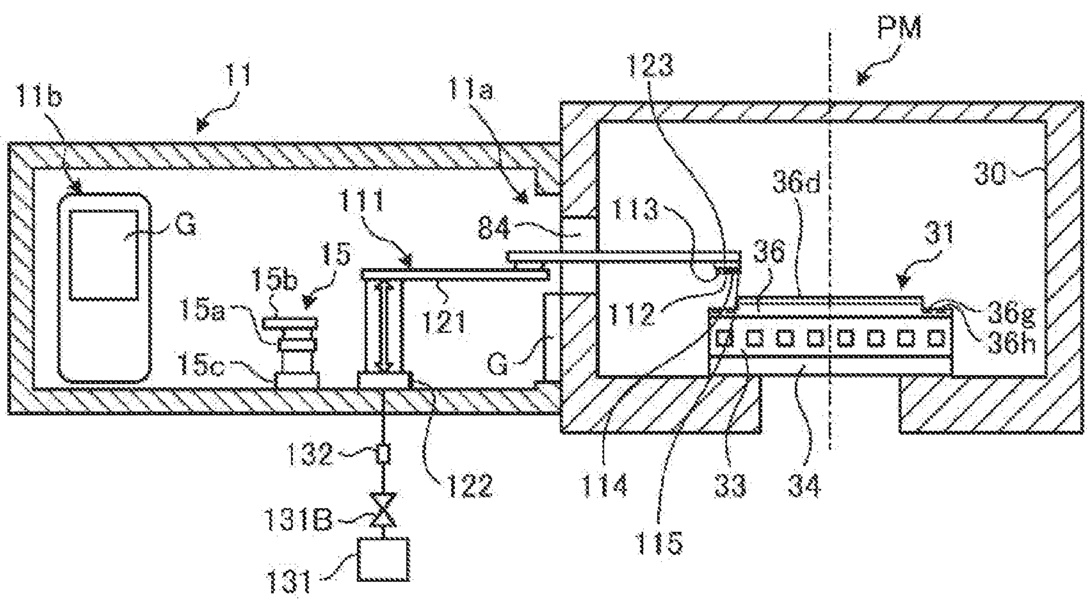
FIG. 9B is a diagram illustrating an example of an operation when an edge ring is unloaded from the processing container and the placement table is cleaned.
Figure 10:
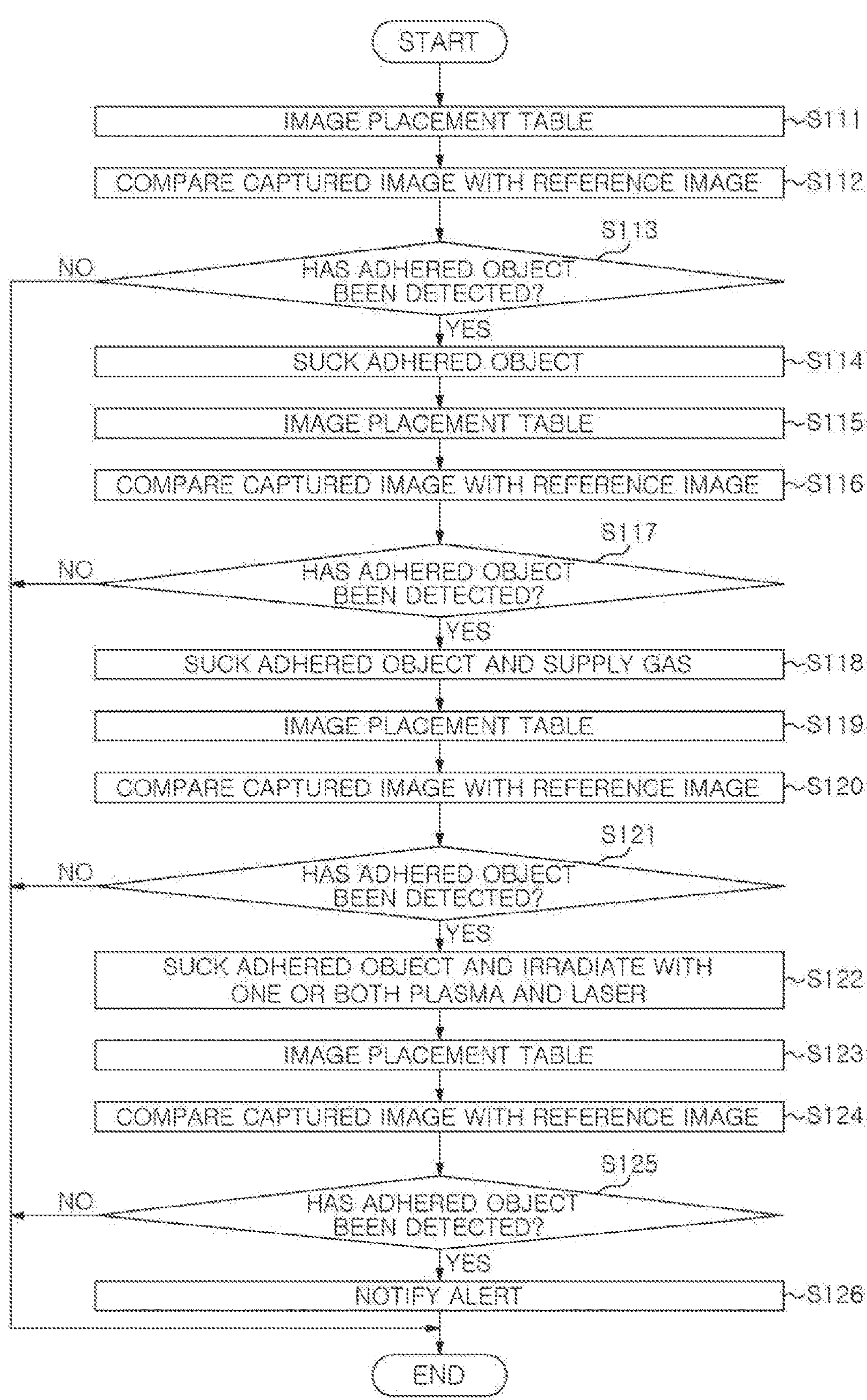
FIG. 10 is a flowchart illustrating an example of processing for cleaning the placement table.

Next, an example of an operation when the edge ring ER is unloaded from the processing container 30 and the placement table 31 is cleaned will be described with reference to FIGS. 9A, 9B, and 10. FIGS. 9A and 9B are diagrams illustrating an example of an operation when the edge ring ER is unloaded from the processing container 30 and the placement table 31 is cleaned. FIG. 10 is a flowchart illustrating an example of processing for cleaning the placement table 31. Further, FIG. 10 corresponds to the processing of step S103 in FIG. 8.

When the edge ring ER is unloaded from the processing container 30, the gate valve G of the process module PM opens. Accordingly, the vacuum transport chamber 11 and the process module PM (processing container 30) communicate via the transport port 11*a* and the gate 84. When the vacuum transport chamber 11 and the processing container 30 communicate, the second lifter pin protrudes from the placement table 31, and the edge ring ER is placed above the placement table 31. The transport mechanism 15 moves the fork portion 15*b* at the tip of the arm portion 15*a* to a height corresponding to the gate 84 using the support portion 15*c*. The transport mechanism 15 extends the arm portion 15*a* toward the transport port 11*a* to move the fork portion 15*b* to the lower side of the edge ring ER via the transport port 11*a*. When the second lifter pin is lowered, the transport mechanism 15 receives the edge ring ER supported on the second lifter pin by the fork portion 15*b*, as illustrated in FIG. 9A. The transport mechanism 15 contracts the arm portion 15*a* in which the edge ring ER is held and unloads the edge ring ER from the processing container 30.

Next, the transport mechanism 15 moves the fork portion 15*b* holding the edge ring ER to a height corresponding to the support on the empty lower end side of the storage chamber ST. The transport mechanism 15 rotates the arm portion 15*a* toward the storage chamber ST and moves the edge ring ER upward to the empty support on the lower end side. The transport mechanism 15 lowers the arm portion 15*a* and stores the edge ring ER in the empty support on the lower end side.

Next, the robot arm 111 moves the head portion 123 at the tip of the arm portion 121 to the height corresponding to the gate 84 using the support portion 122. As illustrated in FIG. 9B, the robot arm 111 extends the arm portion 121 toward the transport port 11*a* and causes the head portion 123 to be close to the placement table 31 via the transport port 11*a*. As illustrated in FIG. 10, the imaging portion 115 images the placement table 31 from above and outputs the obtained captured image to the controller 10 (step S111). That is, the imaging portion 115 images the placement surface 36*d*, the outer circumferential surface 36*e*, and the ER placement surface 36*f* of the electrostatic chuck 36, and outputs an obtained captured image to the controller. The controller 10 compares the captured image with a reference image obtained by imaging the cleaned or new placement table 31 in advance to detect the presence or absence of an adhered object on the placement table 31 (step S112). When an adhered object is detected from the captured image (step S113: Yes), the controller 10 moves the suction port 112 to the position of the adhered object and controls the valve 131B to start suction of the suction port 112. Accordingly, the adhered object on the placement table 31 (that is, the adhered object remaining on the placement surface 36*d*, the outer circumferential surface 36*e*, the ER placement surface 36*f*, and the like of the electrostatic chuck 36) are sucked by the suction port 112 (step S114). For example, when dry cleaning is performed in a state where the edge ring ER is placed on the placement table 31, reaction products are not completely removed from the outer circumferential surface of the electrostatic chuck 36 and remains as an adhered object. In this case, the controller 10 sucks, for example, the remaining object to adhered to the outer circumferential surface of the electrostatic chuck 36 from the suction port 112.

In addition, the suction port 112 may suck the adhered object on the placement table 31 in which a state in which an inert gas is supplied from the shower head 46 into the processing container 30 so that the pressure inside the processing container 30 and the vacuum transport chamber 11 is maintained. As the inert gas, for example, Ar, $N_2$, dry air, or the like is used. Further, a supply source of the inert gas is not limited to the shower head 46, and may be, for example, a purge port (not illustrated) that supplies a gas when the inside of the processing container 30 opens to the atmosphere. Further, the suction port 112 may suck the object to adhered to the placement table 31 in a state where the inert gas is supplied into the vacuum transport chamber 11 from the gas supply portion of the vacuum transport chamber 11. Further, the suction port 112 may suck the object to adhered to the placement table 31 in a state where the inert gas is supplied to both the processing container 30 and the vacuum transport chamber 11.

When suction from the suction port 112 is performed, the controller 10 monitors whether the number of particles for each predetermined particle diameter category and the total number of fine particles obtained from the measurement device 132 are equal to or less than the predetermined threshold value. When the number of fine particles equal to or less than the predetermined threshold value, the controller 10 controls the valve 131B to stop the suction from the suction port 112.

When the suction from the suction port 112 is stopped, the imaging portion 115 images the placement table 31 again from above and outputs the obtained captured image to the controller 10 (step S115). The controller 10 compares the captured image with a reference image obtained by imaging the cleaned or new placement table 31 in advance to detect the presence or absence of an adhered object on the placement table 31 (step S116). When the adhered object is detected again from the captured image (step S117: Yes), the controller 10 controls the valve 131B so that suction through the suction port 112 is started. In this case, the supply port 113 supplies gas to the placement table 31 (step S118). The suction port 112 sucks the adhered object together with the gas supplied from the supply port 113. The controller 10 controls the valve 131B to stop suction from the suction port 112 when the number of particles for each predetermined particle diameter category and the total number of fine particles are equal to or less than the threshold value.

When the suction from the suction port 112 is stopped, the imaging portion 115 images the placement table 31 from above again and outputs the obtained captured image to the controller 10 (step S119). The controller 10 compares the captured image with a reference image obtained by imaging the cleaned or new placement table 31 in advance to detect the presence or absence of an adhered object on the placement table 31 (step S120). When the adhered object is detected again from the captured image (step S121: Yes), the controller 10 controls the valve 131B so that the suction through the suction port 112 is started. In this case, the irradiation portion 114 irradiates the placement table 31 with plasma, laser, or both the plasma and the laser to remove the adhered object from the placement table 31 (step S122). The suction port 112 sucks the adhered object removed from the placement table 31. Further, the controller 10 may perform control so that the placement table 31 is irradiated with one or both of the plasma and the laser using the irradiation portion 114 and then the adhered object is sucked through the suction port 112. When the number of fine particles obtained from the measurement device 132 is equal to or less than the threshold value, the controller 10 controls the valve 131B to stop the suction from the suction port 112.

When the suction from the suction port 112 is stopped, the imaging portion 115 images the placement table 31 from above again and outputs an obtained captured image to the controller (step S123). The controller 10 compares the captured image with a reference image obtained by imaging the cleaned or new placement table 31 in advance to detects the presence or absence of an adhered object on the placement table 31 (step S124). When the adhered object is detected again from the captured image (step S125: Yes), the controller 10 notifies the operator of the substrate processing system 1 of an alert (step S126). The operator who has received the notification of the alert opens the processing container 30 to the atmosphere and performs maintenance, including cleaning work on the placement table 31.

Further, when no adhered object is detected from the captured image (step S113: No, step S117: No, step S121: No, and step S125: No), the controller 10 performs processing for cleaning the placement table 31. Thus, the placement table 31 is cleaned.

When the cleaning of the placement table 31 ends, the robot arm 111 contracts the arm portion 121 to return the suction port 112, the supply port 113, the irradiation portion 114, and the imaging portion 115 to an original position in the vacuum transport chamber 11.

Next, an example of an operation when the replacement edge ring ER is loaded into the processing container 30 will be described with reference to FIGS. 11A to 11D. FIGS. 11A to 11D are diagrams illustrating an example of an operation when the edge ring ER is loaded into the processing container 30. FIG. 12 is a flowchart illustrating an example of processing for correcting the position of the edge ring ER after loading. Further, FIG. 12 corresponds to the processing of step S105 in FIG. 8.

When the replacement edge ring ER is loaded into the processing container 30, the transport mechanism 15 moves the fork portion 15*b* to the height corresponding to the support on the upper end side of the storage chamber ST on which the replacement edge ring ER is placed. The transport mechanism 15 rotates the arm portion 15*a* toward the replacement edge ring ER, and holds the replacement edge ring ER with the fork portion 15*b*. The transport mechanism 15 rotates the arm portion 15*a* toward the gate 84 in a state where the replacement edge ring ER is held.

Next, the transport mechanism 15 moves the fork portion 15*b* to the height corresponding to the gate 84. The transport mechanism 15 extends the arm portion 15*a* toward the transport port 11*a*, as shown by a broken line in FIG. 11A to move the replacement edge ring ER to the upper side of the placement table 31 via the transport port 11*a* and the gate 84.

When the fork portion 15*b* holding the replacement edge ring ER reaches the upper side of the placement table 31, the second lifter pin (not illustrated) protrudes from the placement table 31 and the edge ring ER is passed from the fork portion 15*b* to the second lifter pin. When the replacement edge ring ER is passed from the fork portion 15*b* to the second lifter pin, the transport mechanism 15 contracts the arm portion 15*a* to return the fork portion 15*b* into an original position of the vacuum transport chamber 11. The second lifter pin supporting the replacement edge ring ER is lowered, and the replacement edge ring ER is placed on the outer circumferential portion of the placement table 31.

Figure 11A:
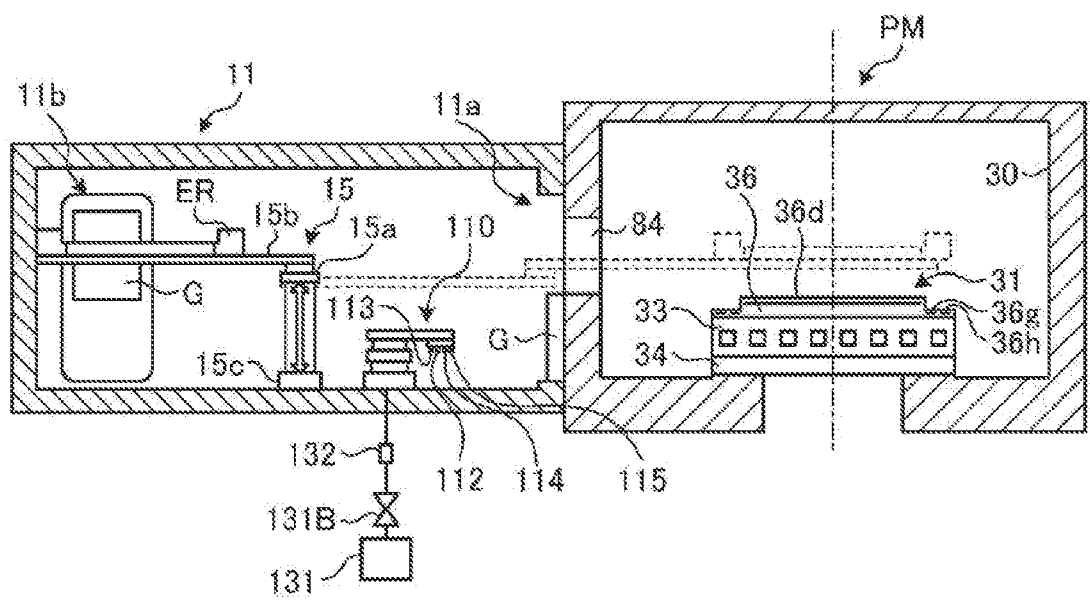
FIG. 11A is a diagram illustrating an example of an operation when an edge ring is loaded into the processing container.
Figure 11B:
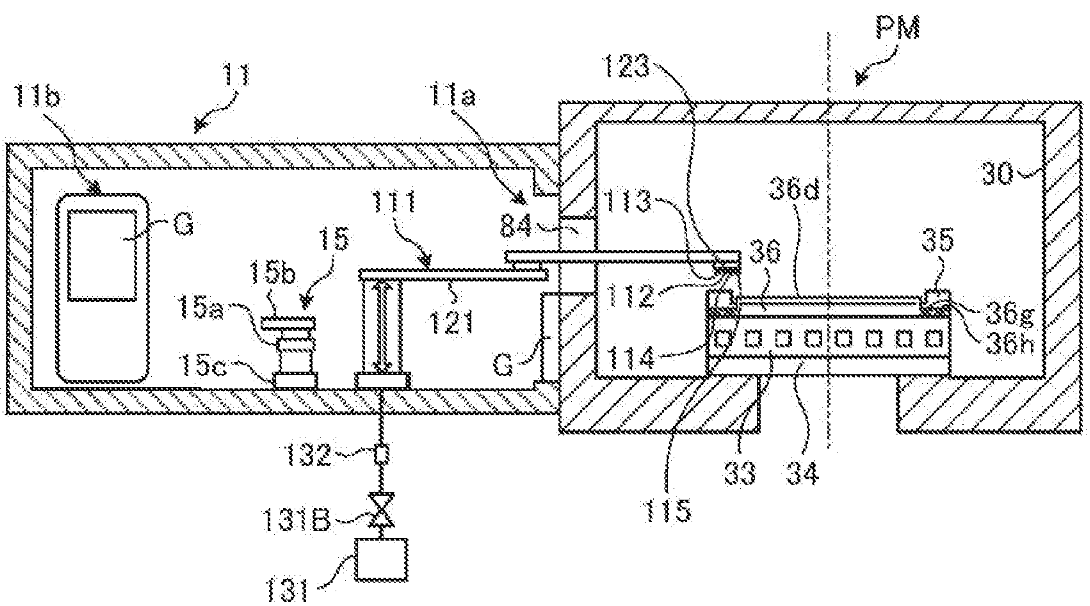
FIG. 11B is a diagram illustrating an example of an operation when an edge ring is loaded into the processing container.
Figure 12:
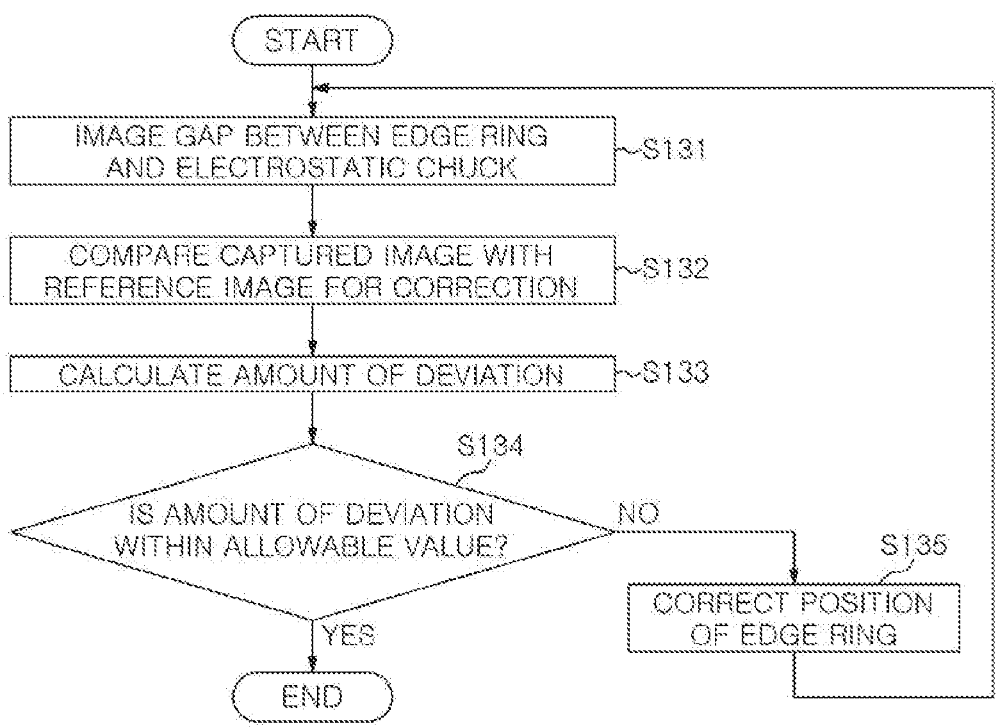
FIG. 12 is a flowchart illustrating an example of processing for correcting a position of the edge ring after loading.

Next, the robot arm 111 moves the head portion 123 to the height corresponding to the gate 84, as illustrated in FIG. 11B. The robot arm 111 extends the arm portion 121 toward the transport port 11*a* so that the head portion 123 approaches the placement table 31 via the transport port 11*a* and the gate 84. As illustrated in FIG. 12, the imaging portion 115 images the gap between the replacement edge ring ER and the electrostatic chuck 36 of the placement table 31 at each of a plurality of positions in the circumferential direction (step S131). For example, the imaging portion 115 sequentially images the replacement edge ring ER and the electrostatic chuck 36 of the placement table 31 at a plurality of imaging positions set at equal intervals in the circumferential direction of the placement table 31.

Figure 13:
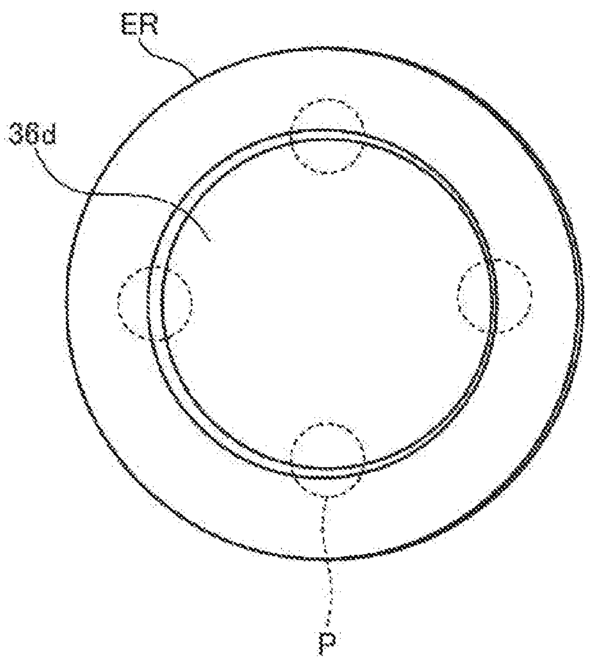
FIG. 13 is a diagram illustrating an example of an imaging position in the imaging portion.

FIG. 13 is a diagram illustrating an example of an imaging position in the imaging portion 115. FIG. 13 corresponds to a top view of the replacement edge ring ER and the electrostatic chuck 36 of the placement table 31 as seen from above. In FIG. 13, the placement surface 36*d* of the placement table 31 is illustrated in a disk shape, and the replacement edge ring ER is illustrated in a ring shape around the placement surface 36*d*. Four imaging positions P in the imaging portion 115 are set at equal intervals at every angle of 90 degrees with respect to a circumferential direction of the placement table 31. Further, the number of imaging positions may be set to three or less, and may be set to five or more in the circumferential direction of the placement table 31. Further, the imaging portion 115 may collectively image the gap between the replacement edge ring ER and the electrostatic chuck 36 of the placement table 31.

FIG. 11B will be referred to. The imaging portion 115 outputs a captured image obtained by imaging a gap between the replacement edge ring ER and the electrostatic chuck 36 of the placement table 31 at each of a plurality of positions in a circumferential direction, to the controller 10. As illustrated in FIG. 12, the controller 10 compares the captured image with a reference image for correction obtained by imaging the edge ring ER in a state without a deviation in advance (step S132), and calculates an amount of deviation between a gap width and a reference width for the plurality of positions in the circumferential direction (step S133). The reference width is, for example, a width of the gap measured in advance when a center of the replacement edge ring ER matches a center of the electrostatic chuck 36.

Figure 11C:
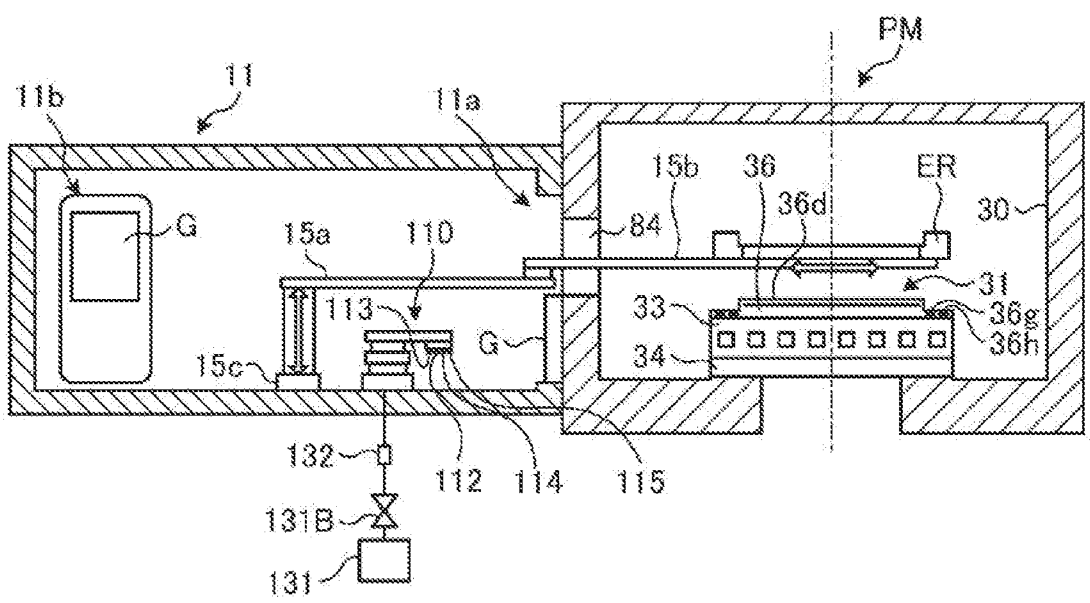
FIG. 11C is a diagram illustrating an example of an operation when an edge ring is loaded into the processing container.

Next, the controller 10 determines whether or not the calculated amount of deviation is within an allowable value (step S134). When the calculated amount of deviation is outside the allowable value (step S134: No), the controller 10 controls the transport mechanism 15 to correct the position of the replacement edge ring ER by the calculated amount of deviation (step S135). That is, when a second lifter pin (not illustrated) protrudes from the placement table 31 and the replacement edge ring ER is placed above the placement table 31, the transport mechanism 15 moves the fork portion 15*b* to the height corresponding to the gate 84. The transport mechanism 140 extends the arm portion 15*a* toward the transport port 11*a* to move the fork portion 15*b* to the lower side of the replacement edge ring ER via the transport port 11*a*. When the second lifter pin is lowered, the transport mechanism 15 receives the replacement edge ring ER supported on the second lifter pin with the fork portion 15*b*, as illustrated in FIG. 11C. The transport mechanism 15 moves the arm portion 15*a* in a horizontal direction in a state where the replacement edge ring ER is held, so that the calculated amount of displacement becomes 0. When the replacement edge ring ER moves and the amount of deviation becomes 0, the second lifter pin protrudes from the placement table 31, and the replacement edge ring ER is passed from the fork portion 15*b* to the second lifter pin. When the replacement edge ring ER is passed from the fork portion 15*b* to the second lifter pin, the transport mechanism 15 contracts the arm portion 15*a* to return the fork portion 15*b* into the original position in the vacuum transport chamber 11. The second lifter pin supporting the replacement edge ring ER is lowered, and the replacement edge ring ER is placed on the outer circumferential portion of the placement table 31. After the amount of deviation is corrected, the controller 10 returns the processing to step S131, and the imaging portion 115 may image the gap between the replacement edge ring ER and the electrostatic chuck 36 of the placement table 31 and confirm whether the amount of deviation is within the allowable value (steps S131 to S134). Further, when the amount of deviation is outside the allowable value, the controller 10 may perform correction again so that the amount of deviation of the replacement edge ring ER becomes 0 as described above (step S135).

Further, when the calculated amount of deviation is within the allowable value (step S134: Yes), the controller 10 ends the processing. Accordingly, the loading of the replacement edge ring ER into the processing container 30 is completed.

Figure 11D:
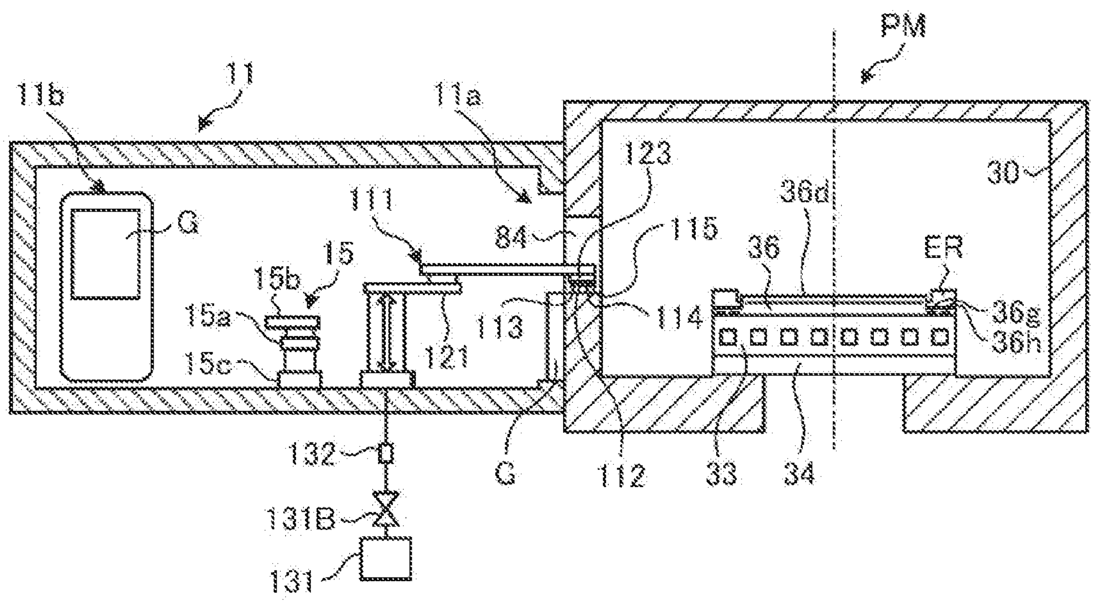
FIG. 11D is a diagram illustrating an example of an operation when an edge ring is loaded into the processing container.

When the loading of the edge ring ER into the processing container 30 is completed, the robot arm 111 moves the head portion 123 at the tip of the arm portion 121 to the height corresponding to the gate 84 using the support portion 122. As illustrated in FIG. 11D, the robot arm 111 extends the arm portion 121 toward the transport port 11*a* and causes the head portion 123 to be close to the gate 84 via the transport port 11*a*. Thereafter, the robot arm 111, the suction port 112, the supply port 113, the irradiation portion 114, and the imaging portion 115 operate in the same order as that at the time of cleaning of the placement table 31, to clean the gate 84.

The operation when the replacement edge ring ER is loaded into the processing container 30 has been described above, but the present disclosure is not limited to the replacement edge ring ER, and the same applies to an operation when the edge ring ER temporarily unloaded from the process module PM and retreated to the support of the storage chamber ST is loaded into the processing container 30 again.

Modification Examples

Figure 14:
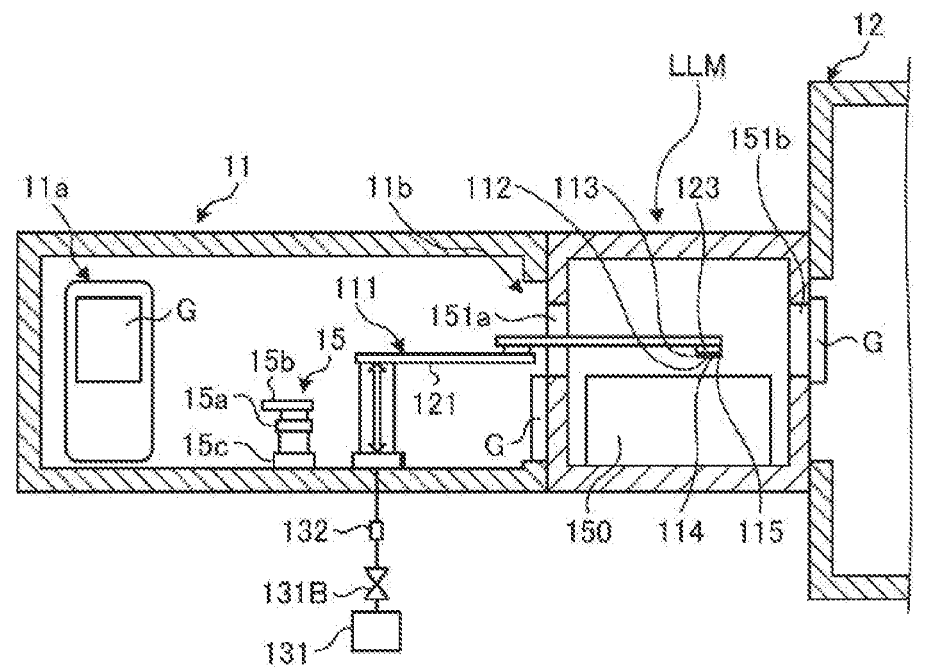
FIG. 14 is a diagram illustrating an example of an operation when a pedestal inside a load lock module is cleaned.

Although, in the above embodiment, a case in which the placement table 31 is cleaned as the target object in the processing container 30 has been described, the substrate processing system 1 may clean the target object inside the load lock module LLM. The target object in the load lock module LLM may be, for example, a pedestal on which the wafer W is placed. FIG. 14 is a diagram illustrating an example of an operation when the pedestal in the load lock module LLM is cleaned. The load lock module LLM includes an opening 151*a* communicating with the vacuum transport chamber 11, and an opening 151*b* communicating with the normal pressure transport chamber 12. A gate valve G is attached to each of the opening 151*a* communicating with the vacuum transport chamber 11 and the opening 151*b* communicating with the normal pressure transport chamber 12. A pedestal 150 on which the wafer W is placed is provided inside the load lock module LLM. When the pedestal 150 inside the load lock module LLM is cleaned, both the gate valve G on the vacuum transport chamber 11 side and the gate valve G on the normal pressure transport chamber 12 side are closed, and the load lock module LLM is evacuated. The gate valve G on the vacuum transport chamber 11 side opens in a state where the load lock module LLM is at a predetermined vacuum level, in other words, in a state where the atmosphere of the load lock module LLM switched to the vacuum atmosphere. The transport port 11*b* of the vacuum transport chamber 11 communicates with the load lock module LLM when the gate valve G on the vacuum transport chamber 11 side opens, as illustrated in FIG. 14. The suction mechanism 110 sucks an object adhered to the pedestal 150 inside the load lock module LLM via the transport port 11*b*. That is, the robot arm 111, the suction port 112, the supply port 113, the irradiation portion 114, and the imaging portion 115 of the suction mechanism 110 operate in the same order as that at the time of cleaning of the placement table 31 to clean the pedestal 150 inside the load lock module LLM.

Figure 15:
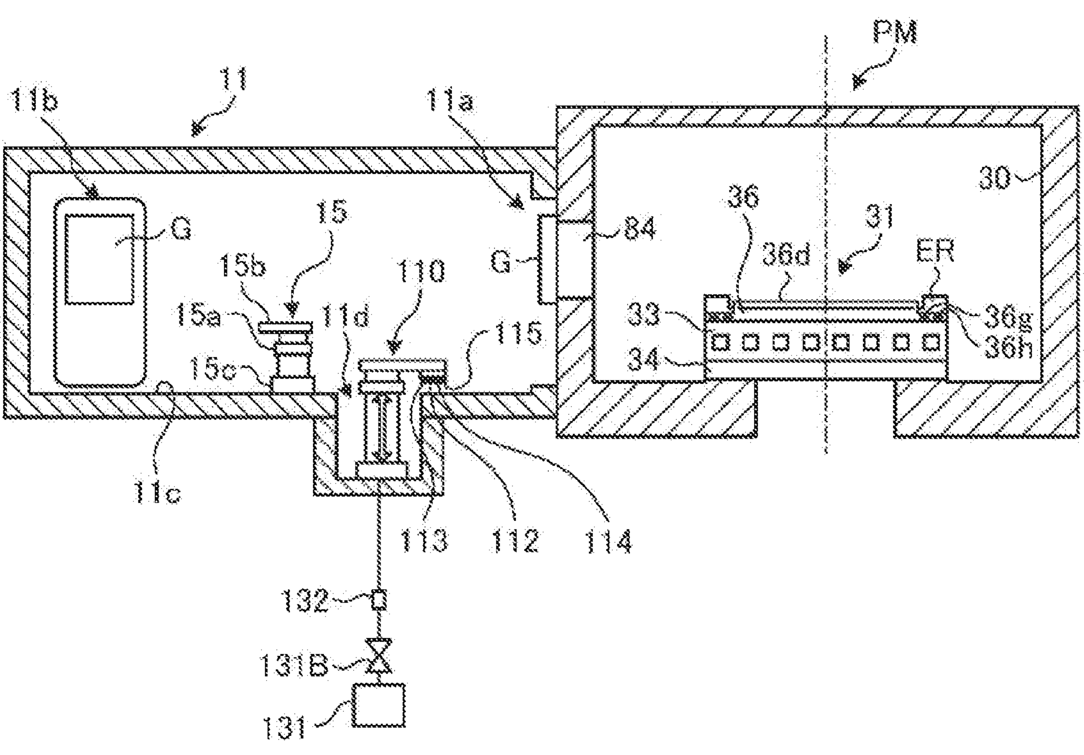
FIG. 15 is a diagram illustrating an example of an operation when a bottom surface of the vacuum transport chamber is cleaned.

In addition, the substrate processing system 1 may clean the bottom surface of the vacuum transport chamber 11. FIG. 15 is a diagram illustrating an example of an operation when a bottom surface 11*c* of the vacuum transport chamber 11 is cleaned. The vacuum transport chamber 11 includes a recessed portion 11*d* that is recessed from the bottom surface 11*c* of the vacuum transport chamber 11. The suction mechanism 110 is disposed in the recessed portion 11*d* and sucks the object adhered to the bottom surface 11*c* of the vacuum transport chamber 11. That is, the robot arm 111 of the suction mechanism 110 moves the head portion 123 to a height corresponding to the bottom surface 11*c* of the vacuum transport chamber 11, as illustrated in FIG. 15. Thereafter, the robot arm 111, the suction port 112, the supply port 113, the irradiation portion 114, and the imaging portion 115 operate in the same order as that at the time of cleaning of the placement table 31, to clean the bottom surface 11*c* of the vacuum transport chamber 11.

Thus, the substrate processing system (for example, the substrate processing system 1) related to the embodiment includes a substrate processing device (for example, the process module (PM)), a vacuum transport chamber (for example, the vacuum transport chamber 11), a transport mechanism (for example, the transport mechanism 15), a suction mechanism (for example, the suction mechanism 110), and a controller (for example, the controller 10). The substrate processing apparatus includes a vacuum processing chamber (for example, the processing container 30) in which vacuum processing is executed for a substrate (for example, the wafer W). The vacuum transport chamber is connected to the vacuum processing chamber and includes a transport port (for example, the transport port 11*a*) capable of communicating with the vacuum processing chamber. The transport mechanism is disposed in the vacuum transport chamber and transports the substrate via the transport port. The suction mechanism is disposed in the vacuum transport chamber and sucks an object adhered to a part (for example, the placement table 31) inside the vacuum processing chamber via the transport port. The controller controls the transport mechanism and the suction mechanism. This makes it possible for the substrate processing system to clean the inside of the vacuum transport chamber with high efficiency without opening the vacuum processing chamber to the atmosphere.

In addition, the controller performs control so that the suction mechanism enters the vacuum processing chamber via the transport port and suck an object adhered to the part inside the vacuum processing chamber. This makes it possible for the substrate processing system to clean the inside of the vacuum transport chamber with high efficiency without opening the vacuum processing chamber to the atmosphere.

Further, the suction mechanism includes an arm (for example, the robot arm 111) and a suction port (for example, the suction port 112) provided at the tip of the arm. The controller performs control so that the suction port provided at the tip of the arm enters the vacuum processing chamber via the transport port, and an object adhered to the part inside the vacuum processing chamber is sucked from the suction port, making it possible to suck the adhered object with the suction port near the target object inside the vacuum processing chamber.

In addition, when the adhered object is sucked, the controller performs control so that an inert gas is supplied to one or both of the inside of the vacuum processing chamber and the inside of the vacuum transport chamber. This makes it possible to suck an adhered object along with the inert gas through the suction port.

Further, the suction mechanism further includes a supply port (for example, the supply port 113) provided at the tip of the arm. The supply port supplies a gas toward the part inside the vacuum processing chamber. This makes it possible to suck the adhered object along with the inert gas through the suction port while blowing away an adhered object from the target object inside the vacuum processing chamber with the inert gas.

Further, the suction mechanism further includes an irradiation portion (for example, the irradiation portion 114) provided at the tip of the arm. The irradiation portion irradiates the part inside the vacuum processing chamber one or both of plasma and laser. This makes it possible to suck the adhered object removed from the target object inside the vacuum processing chamber through the suction port.

Further, the suction mechanism further includes an imaging portion (for example, the imaging portion 115) provided at the tip of the arm. The imaging portion images the part inside the vacuum processing chamber. This makes it possible to obtain a captured image used to detect the presence or absence of an adhered object.

Further, the substrate processing system includes a valve (for example, the valve 131B) provided in an exhaust pipe (for example, the exhaust pipe 131A) connecting the suction port to an exhaust device (for example, the exhaust device 131), and a measurement device (for example, the measurement device 132) that measures the number of fine particles flowing inside the exhaust pipe. When the number of fine particles measured by the measurement device is equal to or less than the predetermined threshold value, the controller controls the valve so that suction from the suction port is stopped. This allows the suction from the suction port to be stopped at an appropriate timing.

Further, the part is a placement table (for example, the placement table 31) including a first placement portion (for example, the electrostatic chuck 36) on which a substrate is placed, and a second placement portion (for example, the outer circumferential portion) provided in a ring shape in an outer recess portion of the first placement portion, an edge ring (for example, the edge ring ER) being placed on the second placement portion. The controller performs control so that object to adhered to the first placement portion of the placement table is sucked while the substrate is unloaded by the transport mechanism. This makes it possible to clean the placement portion of the placement table that is exposed upon unloading of the substrate.

Further, the controller performs control so that at least object to adhered to the second placement portion of the placement table is sucked in a state where the edge ring is unloaded by the transport mechanism. This makes it possible to clean the outer circumferential surface of the placement portion of the placement table, which is exposed upon unloading the edge ring.

Further, the controller images the gap between the edge ring and the first placement portion of the placement table at each of a plurality of positions in the circumferential direction using the imaging portion (for example, the imaging portion 115) at the tip of the arm after the transport mechanism loads the edge ring into the vacuum processing chamber via the transport port and places the edge ring on the second placement portion of the placement table. This makes it possible to obtain a captured image for correcting the position of the replacement edge ring placed on the second placement portion of the placement table.

Further, the controller 10 calculates an amount of deviation between a gap width and a reference width for each of the plurality of positions in the circumferential direction based on the captured image obtained by imaging, and controls the transport mechanism based on the amount of deviation. This makes it possible to correct the position of the edge ring for replacement.

Further, the substrate processing system further includes a load lock chamber (for example, the load lock module LLM) that is connected to the vacuum transport chamber and switches an atmosphere between a vacuum atmosphere and a normal pressure atmosphere. The vacuum transport chamber includes a transport port (for example, the transport port 11*b*) that can communicate with the load lock chamber. The controller performs control so that the suction mechanism enters the load lock chamber via the transport port in a state where an atmosphere of the load lock chamber is switched to the vacuum atmosphere and sucks at least an object adhered to the pedestal on which the substrate is placed inside the load lock chamber. This makes it possible for the substrate processing system to clean the inside of the load lock chamber with high efficiency without opening the load lock chamber to the atmosphere.

Further, the vacuum transport chamber includes a recessed portion (for example, the recessed portion 11*d*) that is recessed from the bottom surface of the vacuum transport chamber (for example, the bottom surface 11*c*), the suction mechanism is disposed in the recessed portion, and the controller sucks the object adhered to the bottom surface of the vacuum transport chamber. This makes it possible for the substrate processing system to clean the bottom surface of the vacuum transport chamber with high efficiency without opening the vacuum processing chamber to the atmosphere.

(Others)

In the above embodiment, a case in which the placement table 31 serving as the target object inside the processing container 30 is cleaned has been described by way of example, but the disclosed technology is not limited thereto. In the substrate processing system 1, a part other than the placement table 31 may be cleaned as long as the part is located inside the processing container 30. Further, the controller 10 may compare the captured image obtained by imaging the part inside the processing container 30 using the imaging portion 115 with a captured image obtained by imaging a new part and determine an abnormality in the part inside the processing container 30 based on at least one of a surface state, a shape, and a size. Further, when the controller 10 determines that an abnormality has occurred in the part inside the processing container 30, the controller 10 may output a part replacement instruction.

Further, in the above embodiment, a case in which the edge ring ER is replaced as a consumable part has been described by way of example, but the disclosed technology is not limited thereto. The consumable part that is a replacement target may be a cover ring (not illustrated) disposed on the outer circumferential side of the edge ring ER, in addition to the edge ring ER. The consumable part may be any part that can be loaded into and unloaded out of the processing container 30 by a transport mechanism such as a robot arm.

Further, in the above embodiment, the imaging portion 115 may be configured to be able to acquire a three-dimensional image. As this imaging portion 115, for example, a 3D scanner or the like may be used. Further, the imaging portion 115 may compare the acquired three-dimensional image with a reference image to detect the adhered object.

Further, in the above embodiment, the suction port 112 and the supply port 113 may be provided on the lower surface of the head portion 123 so that a direction in which the gas supplied from the supply port 113 is reflected by the placement table 31 matches a direction in which the adhered object is sucked by the suction port 112.

Further, in the above embodiment, the supply port 113 may supply dry ice instead of the gas or together with the gas. In this case, the object to adhered to the placement table 31 is removed by collision with dry ice and is sucked by the suction port 112.

In addition, in the above embodiment, the supply port 113 may supply a chemical solution instead of or together with the gas. In this case, the object to adhered to the placement table 31 is dissolved by the chemical solution and is sucked with the chemical solution by the suction port 112. As the chemical solution, for example, alcohol may be used.

Further, in the above embodiment, the suction port 112, the supply port 113, the irradiation portion 114, and the imaging portion 115 may be configured to be detachable from the lower surface of the head portion 123.

Further, in the above embodiment, the disposition positions of the suction port 112, the supply port 113, the irradiation portion 114, and the imaging portion 115 may be exchangeable.

Further, in the above embodiment, when the vacuum transport chamber 11 and the processing container 30 are caused to communicate with each other and cleaning is performed, pressure in the vacuum transport chamber 11 and pressure in the processing container 30 may be adjusted so that the processing gas in the processing container 30 does not leak toward the vacuum transport chamber 11. For example, the pressure in the vacuum transport chamber 11 may be higher than the pressure in the processing container 30.

Further, in the above embodiment, a self-propelled cleaning robot may be provided inside the vacuum transport chamber 11. The self-propelled cleaning robot may clean the inside of the vacuum transport chamber 11. An arm having a cleaning device placed thereon may be advanced into the processing container 30 from a self-propelled body, and the inside of the processing container 30 is cleaned using the cleaning device.

Further, the disclosed embodiment should be considered as being illustrative in all respects and not restrictive. The above embodiment may be omitted, replaced, or changed in various forms without departing from the scope of the appended claims and the spirit thereof.

The invention claimed is:

1. A substrate processing system comprising:

a substrate processing apparatus including a vacuum processing chamber configured to perform processing of a substrate;

a vacuum transport chamber connected to the vacuum processing chamber and including a transport port communicating with the vacuum processing chamber;

a transport mechanism disposed inside the vacuum transport chamber and configured to transport at least the substrate via the transport port;

a suction mechanism disposed inside the vacuum transport chamber and configured to suck an adhered object of a part inside the vacuum processing chamber via the transport port; and controller circuitry configured to control the transport mechanism and the suction mechanism, wherein the suction mechanism includes:

an arm; and a suction port provided at a tip of the arm, the substrate processing system further includes:

a valve provided in an exhaust pipe connecting the suction port to an exhaust device; and a measurement device configured to measure the number of fine particles flowing within the exhaust pipe, and the controller circuitry is configured to:

control the suction port provided at the tip of the arm such that the suction port enters the vacuum processing chamber via the transport port, and the adhered object of the part inside the vacuum processing chamber is sucked from the suction port, and control the valve such that the suction from the suction port is stopped when the number of fine particles measured by the measurement device is equal to or less than a threshold value.

2. The substrate processing system of claim 1, wherein the controller circuitry is configured to control the suction mechanism such that the suction mechanism enters the vacuum processing chamber via the transport port and sucks the adhered object of the part inside the vacuum processing chamber.

3. The substrate processing system of claim 1, wherein, when the adhered object is sucked, the controller circuitry is configured to control such that an inert gas is supplied to one or both of the inside of the vacuum processing chamber and the inside of the vacuum transport chamber.

4. The substrate processing system of claim 1, wherein the suction mechanism further includes:

a supply port provided at the tip of the arm, and wherein, when the adhered object of the part in the vacuum processing chamber is sucked from the suction port, the controller circuitry is configured to control such that a gas is supplied from the supply port toward the part inside the vacuum processing chamber.

5. The substrate processing system of claim 1, wherein the suction mechanism further includes:

an irradiation portion provided at the tip of the arm, when the adhered object of the part inside the vacuum processing chamber is sucked from the suction port, the controller circuitry is configured to control such that the irradiation portion irradiates the part inside the vacuum processing chamber with one or both of plasma and laser.

6. The substrate processing system of claim 1, wherein the suction mechanism further includes:

an imaging portion provided at the tip of the arm, and the controller circuitry is configured to control such that the imaging portion images the part inside the vacuum processing chamber and the adhered object of the part is sucked from the suction port based on an imaging result.

7. The substrate processing system of claim 1, wherein the part is a placement table including a first placement portion on which a substrate is placed, and a second placement portion having a ring shape and provided in an outer recess portion of the first placement portion, an edge ring being placed on the second placement portion, and the controller circuitry is configured to control such that the adhered object of the first placement portion of the placement table is sucked in a state where the substrate is unloaded by the transport mechanism.

8. The substrate processing system of claim 7, wherein the controller circuitry is configured to control such that at least the adhered object of the second placement portion of the placement table is sucked in a state where the edge ring is unloaded by the transport mechanism.

9. The substrate processing system of claim 8, wherein the controller circuitry is configured to control such that a gap between the edge ring and the first placement portion of the placement table is imaged at each of a plurality of positions in a circumferential direction using an imaging portion at the tip of the arm after the transport mechanism loads the edge ring into the vacuum processing chamber via the transport port and places the edge ring on the second placement portion of the placement table.

10. The substrate processing system of claim 9, wherein the controller circuitry is configured to calculate an amount of deviation between a width of the gap and a reference width for each of the plurality of positions in the circumferential direction based on the captured image obtained by imaging, and control the transport mechanism based on the amount of deviation.

11. The substrate processing system of claim 1, further comprising:

a load lock chamber connected to the vacuum transport chamber and configured to switch an atmosphere between a vacuum atmosphere and a normal pressure atmosphere, wherein the vacuum transport chamber has a transport port communicating with the load lock chamber, and the controller circuitry is configured to control such that the suction mechanism enters the load lock chamber via the transport port in a state where an atmosphere of the load lock chamber is switched to a vacuum atmosphere and sucks at least the adhered object of a pedestal on which the substrate is placed inside the load lock chamber.

12. The substrate processing system of claim 1, wherein the vacuum transport chamber includes a recessed portion that is recessed from a bottom surface of the vacuum transport chamber, the suction mechanism is disposed in the recessed portion, and the controller circuitry is configured to control such that an adhered object of the bottom surface of the vacuum transport chamber is sucked.

13. A maintenance method in a substrate processing system which includes a substrate processing apparatus including a vacuum processing chamber configured to perform processing of a substrate, a vacuum transport chamber connected to the vacuum processing chamber and including a transport port communicating with the vacuum processing chamber, a transport mechanism disposed inside the vacuum transport chamber and configured to load or unload the substrate via the transport port, and a suction mechanism disposed inside the vacuum transport chamber and configured to suck an adhered object of a part inside the vacuum processing chamber via the transport port, comprising:

causing the suction mechanism to enter the vacuum processing chamber via the transport port; and sucking the adhered object of the part inside the vacuum processing chamber with the suction mechanism, wherein the suction mechanism includes:

an arm; and a suction port provided at a tip of the arm, and the substrate processing system further includes:

a valve provided in an exhaust pipe connecting the suction port to an exhaust device; and a measurement device configured to measure the number of fine particles flowing within the exhaust pipe, wherein the method further comprises:

controlling the valve such that the suction from the suction port is stopped when the number of fine particles measured by the measurement device is equal to or less than a threshold value; and controlling the suction port provided at the tip of the arm such that the suction port enters the vacuum processing chamber via the transport port, and the adhered object of the part inside the vacuum processing chamber is sucked from the suction port.

* * * * *